(12) United States Patent
Deng

(10) Patent No.: US 11,496,231 B2
(45) Date of Patent: Nov. 8, 2022

(54) METHODS AND APPARATUS TO DETECT A BLANK FRAME IN A DIGITAL VIDEO BROADCAST SIGNAL

(71) Applicant: The Nielsen Company (US), LLC, New York, NY (US)

(72) Inventor: Kevin K. Deng, Safety Harbor, FL (US)

(73) Assignee: THE NIELSEN COMPANY (US), LLC, New York, NY (US)

( * ) Notice: Subject to any disclaimer, the term of this patent is extended or adjusted under 35 U.S.C. 154(b) by 589 days.

(21) Appl. No.: 16/010,078

(22) Filed: Jun. 15, 2018

(65) Prior Publication Data

US 2019/0020429 A1    Jan. 17, 2019

Related U.S. Application Data

(63) Continuation of application No. 13/117,840, filed on May 27, 2011, now abandoned, which is a
(Continued)

(51) Int. Cl.
*H04H 60/32* (2008.01)
*H04N 19/15* (2014.01)
(Continued)

(52) U.S. Cl.
CPC ......... *H04H 60/32* (2013.01); *G01R 19/0015* (2013.01); *G11B 27/28* (2013.01);
(Continued)

(58) Field of Classification Search
USPC ........................................................ 725/14
See application file for complete search history.

(56) References Cited

U.S. PATENT DOCUMENTS 4,677,466 A    6/1987 Lert, Jr. et al.
4,782,401 A    11/1988 Faerber et al.
(Continued)

FOREIGN PATENT DOCUMENTS

EP    1021042 A1    7/2000
WO    0161892    8/2001
(Continued)

OTHER PUBLICATIONS

United States Patent and Trademark Office, "Non-Final Office Action", issued in connection with U.S. Appl. No. 11/534,790, dated Feb. 3, 2010, 23 pages.
(Continued)

*Primary Examiner* — Mikhail Itskovich
(74) *Attorney, Agent, or Firm* — Hanley, Flight & Zimmerman, LLC

(57) ABSTRACT

Methods and apparatus to detect blank images in a digital video broadcast signal are disclosed. An example method of detecting a blank image includes receiving a compressed digital image including a plurality of DC values, analyzing a total number of bits in the digital image to determine if the digital image has a data size small enough to be a blank frame candidate, if the data size is small enough for the digital image to be a blank frame candidate, analyzing multiple areas of the digital image to determine if the multiple areas exhibit substantially a same complexity, if the multiple areas exhibit substantially the same complexity, determining a number of DC values in the plurality of DC values that meet a criterion, comparing the determined number of DC values meeting the criterion to a threshold, and identifying the received digital image as a blank image if the determined number of DC values exceeds the threshold.

1 Claim, 18 Drawing Sheets

Related U.S. Application Data continuation of application No. 11/534,790, filed on Sep. 25, 2006, now Pat. No. 7,984,462, which is a continuation of application No. PCT/US2004/009910, filed on Mar. 29, 2004.

(51) Int. Cl.

| | | |
|---|---|---|
| *H04N 5/45* | (2011.01) | |
| *H04N 5/907* | (2006.01) | |
| *H04H 60/37* | (2008.01) | |
| *H04N 21/81* | (2011.01) | |
| *H04N 21/44* | (2011.01) | |
| *G11B 27/28* | (2006.01) | |
| *H04N 5/85* | (2006.01) | |
| *H04N 21/658* | (2011.01) | |
| *H04N 21/258* | (2011.01) | |
| *G01R 19/00* | (2006.01) | |

(52) U.S. Cl.
CPC .............. *H04H 60/37* (2013.01); *H04N 5/45* (2013.01); *H04N 5/85* (2013.01); *H04N 5/907* (2013.01); *H04N 19/15* (2014.11); *H04N 21/25866* (2013.01); *H04N 21/44008* (2013.01); *H04N 21/6582* (2013.01); *H04N 21/812* (2013.01)

(56) References Cited

U.S. PATENT DOCUMENTS

| | | |
|---|---|---|
| 5,151,788 A | 9/1992 | Blum |
| 5,333,091 A | 7/1994 | Iggulden et al. |
| 5,481,294 A | 1/1996 | Thomas et al. |
| 5,696,866 A | 12/1997 | Iggulden et al. |
| 5,748,263 A | 5/1998 | Ball |
| 5,826,165 A | 10/1998 | Echeita et al. |
| 5,987,210 A | 11/1999 | Iggulden et al. |
| 5,999,689 A | 12/1999 | Iggulden |
| 6,002,443 A | 12/1999 | Iggulden |
| 6,100,941 A | 8/2000 | Dimitrova et al. |
| 6,205,174 B1 | 3/2001 | Fert et al. |
| 6,327,390 B1 | 12/2001 | Sun et al. |
| 6,404,977 B1 | 6/2002 | Iggulden |
| 6,449,392 B1 | 9/2002 | Divakaran et al. |
| 6,459,459 B1 | 10/2002 | Ratakonda |
| 6,469,749 B1 | 10/2002 | Dimitrova et al. |
| 6,597,405 B1 | 7/2003 | Iggulden |
| 6,675,174 B1 | 1/2004 | Bolle et al. |
| 6,771,316 B1 | 8/2004 | Iggulden |
| 7,043,746 B2 | 5/2006 | Ma |
| 7,170,566 B2 | 1/2007 | McGee et al. |
| 7,984,462 B2 | 7/2011 | Deng |
| 2002/0057893 A1 | 5/2002 | Wood et al. |
| 2002/0083440 A1 | 6/2002 | Dupuis et al. |
| 2002/0154885 A1 | 10/2002 | Covell et al. |
| 2003/0053538 A1 | 3/2003 | Katsavoundis et al. |
| 2003/0090706 A1* | 5/2003 | Rijavec ............... H03M 7/3088 358/1.15 |
| 2003/0123841 A1 | 7/2003 | Jeannin |
| 2003/0137546 A1* | 7/2003 | Suh ........................ G11B 27/28 715/838 |
| 2004/0226035 A1 | 11/2004 | Hauser, Jr. |
| 2005/0129330 A1 | 6/2005 | Shyshkin |
| 2005/0195334 A1 | 9/2005 | Yeh et al. |
| 2006/0056820 A1 | 3/2006 | Wu et al. |
| 2006/0174265 A1 | 8/2006 | Hauser, Jr. |

FOREIGN PATENT DOCUMENTS

| | | |
|---|---|---|
| WO | 32093929 A1 | 11/2002 |
| WO | 2005104676 | 11/2005 |
| WO | 2005124583 | 12/2005 |
| WO | 2005125198 | 12/2005 |

OTHER PUBLICATIONS

Philips Consumer Electronics, "Color Superhistograms for Video Representation", Image Processing, 1999, pp. 314-318, vol. 3, Philips Research, 5 pages.

The International Bureau of WIPO, "International Preliminary Report on Patentability", corresponding to International Application Serial No. PCT/US2004/009910, dated Mar. 29, 2007, 5 pages.

The International Bureau of WIPO, "International Search Report", corresponding to International Application No. PCT/US/2004/009910, dated Feb. 28, 2007, 4 pages.

The International Bureau of WIPO, "Written Opinion of the International Searching Authority", corresponding to International Application No. PCT/US2004/009910, dated Feb. 28, 2007, 5 pages.

Boon-Lock Yeo and Bede Liu, "Rapid Scene Analysis on Compressed Video", IEEE Transactions on Circuits and Systems for Video Technology, Dec. 1995, pp. 533-544, vol. 5, No. 6, IEEE.

United States Patent and Trademark Office, "Final Office Action", issued in connection with U.S. Appl. No. 11/534,790, dated Jul. 22, 2009, 28 pages.

United States Patent and Trademark Office, "Non-Final Office Action", issued in connection with U.S. Appl. No. 11/534,790, dated Jan. 14, 2009, 15 pages.

United States Patent and Trademark Office, "Final Office Action", issued in connection with U.S. Appl. No. 11/534,790, dated Aug. 18, 2010, 26 pages.

Canadian Intellectual Property Office, "Examination Report," issued in connection with corresponding Canadian Application No. 2,563,107, dated Oct. 21, 2010 (4 pages).

Canadian Intellectual Property Office, "Examination Report," issued in connection with corresponding Canadian Application No. 2,563,107, dated Feb. 28, 2012 (3 pages).

European Patent Office, "Supplementary European Search Report," issued in connection with corresponding European Application No. 04821943.0, dated May 23, 2012 (4 pages).

European Patent Office, "Examination Report," issued in connection with corresponding European Application No. 04821943.0, dated Sep. 25, 2012 (7 pages).

European Patent Office, "Communication pursuant to Article 94(3) EPC," issued in connection with Application No. 04821943.0, dated Jul. 20, 2015, 6 pages.

United States Patent and Trademark Office, "Non-Final Office Action", issued in connection with U.S. Appl. No. 13/117,840, dated Nov. 20, 2013, 39 pages.

United States Patent and Trademark Office, "Final Office Action", issued in connection with U.S. Appl. No. 13/117,840, dated Jul. 10, 2014, 46 pages.

United States Patent and Trademark Office, "Non-Final Office Action", issued in connection with U.S. Appl. No. 13/117,840, dated Aug. 18, 2017, 32 pages.

United States Patent and Trademark Office, "Final Office Action", issued in connection with U.S. Appl. No. 13/117,840, dated Feb. 15, 2018, 31 pages.

United States Patent and Trademark Office, "Advisory Action" issued in connection with U.S. Appl. No. 13/117,840, dated May 22, 2018, 4 pages.

United States Patent and Trademark Office, "Notice of Allowance," issued in connection with U.S. Appl. No. 11/534,790, dated Apr. 27, 2011, 8 pages.

United States Patent and Trademark Office, "Examiner's Answer to Appeal Brief," issued in connection with U.S. Appl. No. 13/117,840, dated Aug. 27, 2015, 33 pages.

United States Patent and Trademark Office, "Patent Board Decision," issued in connection with U.S. Appl. No. 13/117,840, dated Mar. 9, 2017, 15 pages.

United States Patent and Trademark Office, "Advisory action," issued in connection with U.S. Appl. No. 11/534,790, dated Nov. 16, 2009, 3 pages.

* cited by examiner

| Slice | Slice Vertical Position | Start address |
|---|---|---|
| 1 | 1 | 1 |
| 2 | 2 | 1001 |
| 3 | 2 | 1501 |
| 4 | 3 | 2001 |
| 5 | 4 | 3001 |
| 6 | 4 | 3333 |
| 7 | 5 | 4028 |
| ... | ... | ... |

520

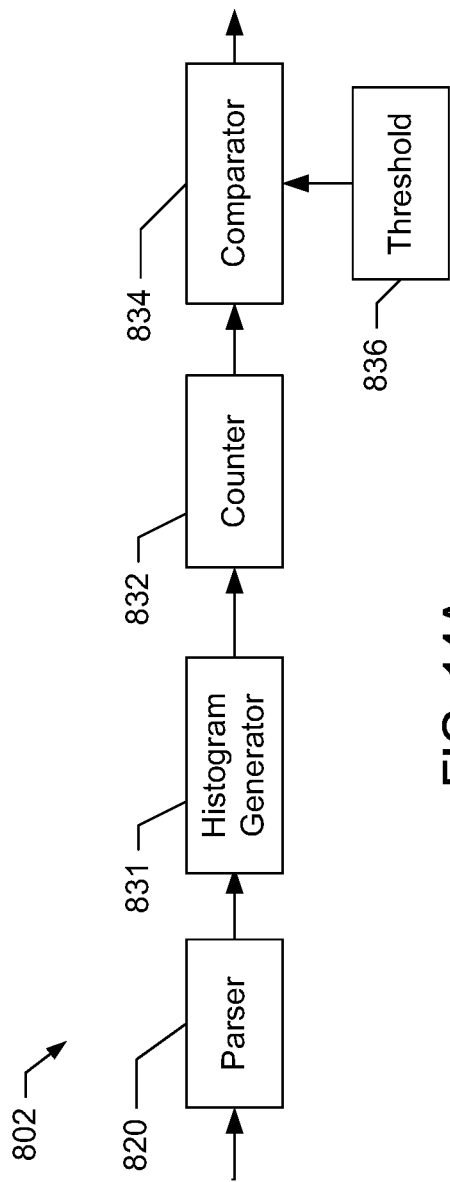

METHODS AND APPARATUS TO DETECT A BLANK FRAME IN A DIGITAL VIDEO BROADCAST SIGNAL

RELATED APPLICATION

This patent arises from a continuation of U.S. patent application Ser. No. 13/117,840, entitled "METHODS AND APPARATUS TO DETECT A BLANK FRAME IN A DIGITAL VIDEO BROADCAST SIGNAL," filed May 27, 2011, which is a continuation of U.S. patent application Ser. No. 11/534,790, now U.S. Pat. No. 7,984,462, entitled "METHODS AND APPARATUS TO DETECT A BLANK FRAME IN A DIGITAL VIDEO BROADCAST SIGNAL," filed on Sep. 25, 2006, which is a continuation of PCT Patent Application Serial No. PCT/US2004/009910, which was filed on Mar. 29, 2004. Priority to U.S. patent application Ser. No. 13/117,840, U.S. patent application Ser. No. 11/534, 790, and PCT Patent Application No. PCT/US2004/009910 is claimed. U.S. patent application Ser. No. 13/117,840, U.S. patent application Ser. No. 11/534,790, and PCT Patent Application No. PCT/US2004/009910 are hereby incorporated by reference in their respective entireties.

TECHNICAL FIELD

The present disclosure pertains to commercial/advertisement measurement and/or verification systems and, more particularly, to methods and apparatus to detect a blank frame in a digital video broadcast signal.

BACKGROUND

As used herein, "broadcast" refers to any sort of electronic transmission of signals from a source to multiple receiving devices. Thus, a "broadcast" may be a cable broadcast, a satellite broadcast, a terrestrial broadcast, a traditional free television broadcast, a radio broadcast, and/or an internet broadcast, and a "broadcaster" may be any entity that transmits signals for reception by a plurality of receiving devices. The signals may include content, (also referred to herein as "programs"), and/or commercials (also referred to herein as "advertisements"). An "advertiser" is any entity that provides an advertisement for inclusion in a broadcast signal.

As is well known, advertisers pay significant sums of money to broadcasters to have their commercials/advertisements broadcast in association with particular programs at particular times (i.e., during a certain "time slot"). Typically, broadcasters honor their contractual obligations to the advertisers and transmit commercials during the agreed upon time slots. However, mistakes and/or last minute programming changes occasionally cause a commercial to be broadcast during a time slot different from the agreed upon time slot, or to not be broadcast at all.

Additionally, businesses such as businesses selling consumer products are very interested in the advertising and selling strategies of their competitors. To this end, these businesses are interested in obtaining competitor expenditure studies which identify data such as the times of broadcast of their competitor's commercials, the channels/programs being sponsored by their competitor, etc. This information reflects how the competitor is spending its advertising dollars and may be used to develop a competing advertising strategy and/or to decipher information about the competitor's strategic plans.

In order to monitor the broadcasting of commercials, monitoring stations may be installed at various locations in various broadcasting areas. These monitoring stations collect information indicative of the commercials broadcast in their associated broadcasting areas, the times/dates at which those commercials were broadcast, and the stations or channels that broadcast those commercials. The collected information may be in an analog and/or a digital format. The information collected for each commercial identified by the monitoring stations may be some or all of the commercial as broadcast, a signature for some or all of the commercial as broadcast (e.g., a proxy uniquely representative of the content of the commercial), and/or a code associated with, and possibly broadcast with, the commercial. The collected information typically uniquely identifies the commercial with which it is associated. It may also identify the station broadcasting the commercial and/or the channel on which the commercial was broadcast and the time/date on which the commercial was broadcast.

Each monitoring station is typically provided with a database storing the codes and/or signatures that are used to identify known commercials. In particular, when a commercial is found in the broadcast, the monitoring station automatically compares the code and/or signature representative of the broadcast to the codes and/or signatures stored in the database to automatically identify the commercial. If a matching code and/or signature is found in the database, the commercial is identified from the database. The identity of the commercial is then stored in a memory. The identity of the commercial is typically stored in association with a time and/or a date stamp identifying the time/date at which the commercial was broadcast and an identification of the channel on which the commercial was broadcast.

In the event an automatic identification of the commercial is not achieved (e.g., the commercial is not yet identified in the database because, for example, it is a new commercial), the monitoring station stores the collected information representative of the commercial (e.g., a code and/or a signature) in memory for later identification by a human being. To make it possible for a human being to identify the commercial, the monitoring station also stores and forwards a copy of at least a portion of the commercial or a replica thereof to enable a human to view and/or hear the commercial. A human being will subsequently view the commercial or the replica of the commercial to determine if it is a commercial, and, if so, if it is a new commercial or a known commercial. If it is a new commercial, the human being will provide a (preferably unique) name for the commercial and add it to the appropriate database(s) in association with a code and/or signature uniquely representative of that commercial to enable automatic identification in the future.

Periodically, the monitoring stations transmit the collected information to one or more central data processing facilities. The central data processing facility(ies) then process the information received from the monitoring stations to identify commercials that were not identifiable to the monitoring station(s) (e.g., via human intervention) as explained above, and to compile reports identifying the commercial that were actually broadcast, the stations and/or channels on which the commercials were broadcast, and the times/dates at which those broadcasts occurred. The report(s) may then be sold to one or more interested parties.

As mentioned above, whenever a broadcast segment cannot be automatically identified as a specific commercial by, for example, comparing a signature of the segment to a database storing signatures of known commercials, it is necessary to have a human being review the broadcast segment to determine if the segment is a new commercial to be added to the database for subsequent automatic identification efforts, if the segment is an already known commercial, or if the segment is not a commercial (e.g., the segment is content). Such human verification efforts are more expensive than automatic identification efforts because the human being must be compensated for their efforts. Therefore, it is desirable to reduce the number of instances requiring human verification. Because new commercials not yet present in the database require human viewing to properly add the commercial to the database, the focus on reducing human verification efforts lies upon distinguishing commercials from content.

More specifically, since commercial monitoring systems are focused on commercial broadcast identification and/or verification as opposed to content identification and/or verification, methods of distinguishing the portions of a broadcast signal that correspond to commercials from portions of the broadcast signal that correspond to content have been proposed. These methods are utilized at the monitoring stations to ensure that the portions of the broadcast signal corresponding to content are discarded while the portions of the broadcast signal corresponding to the commercials are processed as explained above.

Some proposed methods of distinguishing commercials from content rely upon triggers embedded in the broadcast signal. For instance, commercials in video broadcast signals are typically separated from content by one or more blank video frames. Therefore, some known systems attempt to identify blank video frames as a trigger for when to begin collecting and storing the data received at the monitoring station. Because commercials or blocks of commercials are typically interspersed within a broadcast signal in relative short blocks of times (e.g., five minutes or less), the known systems identify commercials and/or blocks of commercials by identifying blank frames (or pairs of blank frames, or groups of blank frames) separated by less than a predetermined length of time (e.g., five minutes). When such a pair of blank video frames (or group of blank video frames) is detected, the known systems begin processing the information collected around the blank frames to identify the commercials, their time/date of broadcast, and/or the station/channel carrying the commercials.

Some known systems attempt to determine when a broadcast image is blank by decompressing digital video streams, and comparing the decompressed video frames to a predetermined color. However, this method has several drawbacks. Decompressing digital content can be time consuming and/or may require special hardware. Further, broadcasters sometimes simultaneously broadcast two content and/or commercial streams with one of the content and/or commercial streams being located in a relatively large primary viewing window and the other of the content and/or commercial streams being located in a relatively small secondary viewing window (e.g., a picture-in-picture window) embedded in or overlying the primary viewing window. Known systems may miss the occurrence of a blank PIP/secondary viewing window due to activity in the main/primary viewing window and/or vice versa.

BRIEF DESCRIPTION OF THE DRAWINGS

FIG. 14A is a block diagram illustrating another example blank slice detector for use in the PIP context.

FIG. 15 is a portion of an example slice map mapping blank slices of an I-frame.

DETAILED DESCRIPTION

U.S. patent application Ser. No. 11/534,790 filed Sep. 25, 2006, U.S. patent application Ser. No. 13/117,840 filed May 27, 2011, and PCT Patent Application Serial No. PCT/US2004/009910 filed Mar. 29, 2004 are hereby incorporated by reference herein in their entireties.

Figure 1:
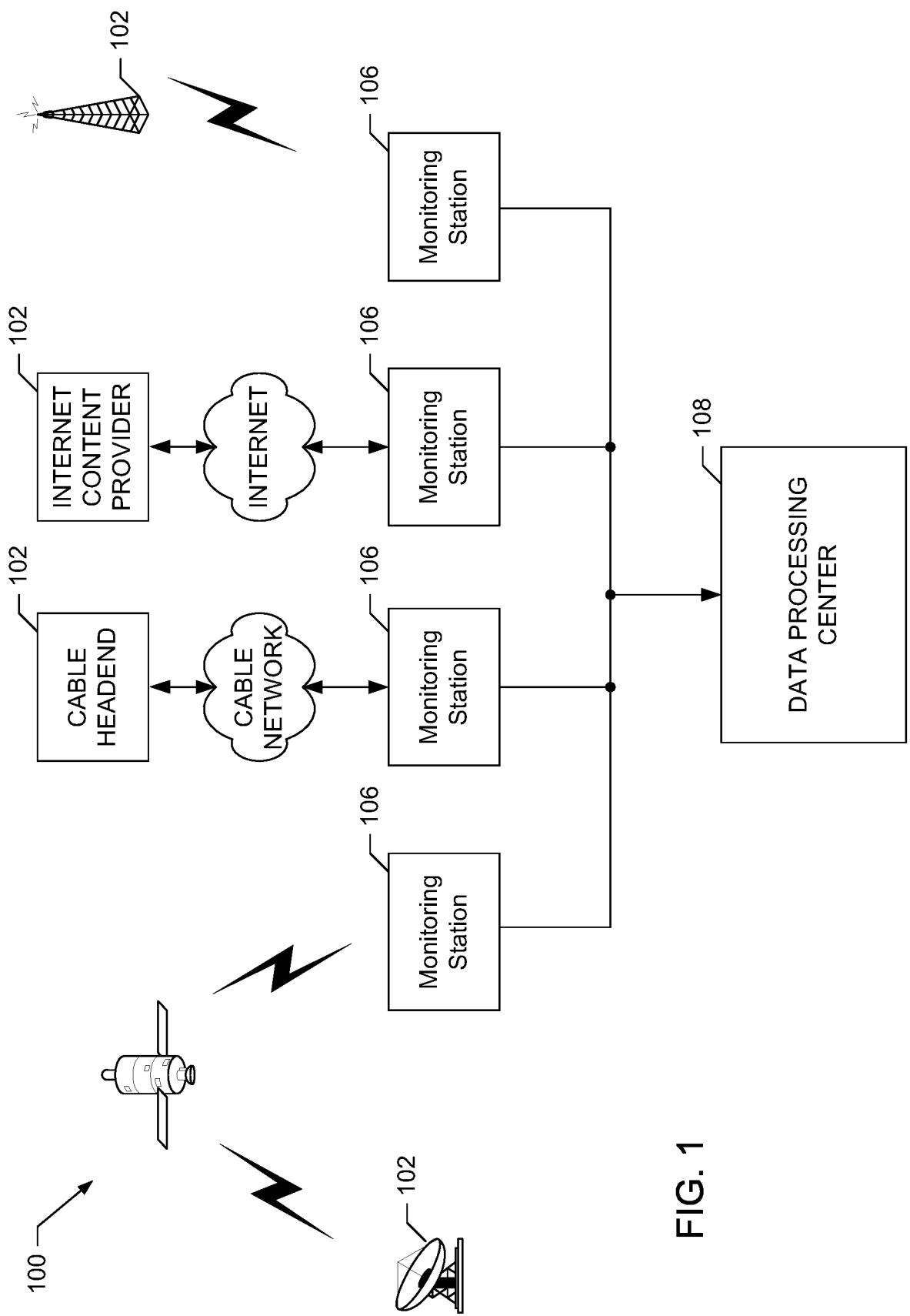
FIG. 1 is a block diagram illustrating an example advertisement monitoring system.

An example commercial/advertising monitoring and verification system 100 is schematically illustrated in FIG. 1. The illustrated system 100 includes one or more video service providers 102 broadcasting video and/or other programming and/or commercials, one or more monitoring stations 106 to collect, attempt to automatically identify, and store commercials broadcast by the video service providers 102, and one or more remote data processing centers 108 to collect and process the data collected by the monitoring stations 106 into useful reports. As used herein, the term "blank image" refers to any image or frame that has a substantially constant brightness. A blank image may be a solid image, an image including one or more than one color, or any other image that has a substantially constant brightness.

The video service providers 102 may be any type of video service provider such as a cable television service provider, a satellite television service provider, an internet content provider that provides, for example, streaming video content, and/or a radio frequency (RF) television service provider as shown in FIG. 1. The service provider 102 may broadcast digital video signals. For example, the service provider 102 may broadcast digital video signals over a wired connection such as a coaxial cable or over a wireless connection such as a satellite and/or a terrestrial broadcast system.

In the example of FIG. 1, each monitoring station 106 is illustrated as monitoring the broadcasts of a particular type of service provider 102. However, persons of ordinary skill in the art will readily appreciate that, in practice, some or all of the monitoring stations 106 may monitor broadcasts from multiple service providers 102 (e.g., channel 2 and channel 7) of the same or different types of services.

In the illustrated example, signals from the service providers 102 are received by the monitoring station(s) 106. The received signals typically include content and advertisements/commercials. As explained below, rather than identifying every portion of the broadcast signals they receive, the monitoring station(s) 106 distinguish the time segments of the broadcast signal carrying commercials (and possibly content) from the time segments of the signal carrying content but no commercials, and store and/or further process the time segments of the broadcast signal containing commercials (or information representative of the received commercials) while discarding the time segments of the broadcast signal containing content. The monitoring station(s) 106 may store this information in an analog and/or a digital form. For example, the monitoring station(s) 106 may store MPEG encoded video frames.

The monitoring station(s) 106 preferably have access to a database (which may be local or remote) storing codes and/or signatures of known commercials and correlating the known codes and/or signatures to commercial names or other identifiers. A commercial name or identifier preferably uniquely identifies a commercial advertisement.

The monitoring station(s) 106 periodically export the data they collect to a data processing center 108. The data processing center 108 processes and/or compiles the information gathered by the monitoring station(s) 106 into reports which may be sold to interested parties. The reports preferably include such information as the name of the advertisement, product name, sponsor, content, message, appearing personalities, time of broadcast, broadcast channel, program sponsored by the advertisement, etc.

As mentioned above, the monitoring stations 106 preferably attempt to automatically identify the commercials they detect. Therefore, the information provided to the remote processing center 108 preferably identifies the commercials logged by the monitoring station(s) 106. However, some commercials may not be identified by the monitoring stations 106. Therefore, the remote data processing center 108 may include a central database to enable automatic identification of commercials that could not be automatically identified at the monitoring stations 106, and may also include one or more display devices such as a television or monitor to facilitate manual identification of commercials when, for example, automatic identification fails or is not possible. The television (if used) may be any type of television. For example, the television may be an NTSC (National Television Standards Committee) compatible television, a high definition television (HDTV), a PC monitor, etc. Additionally, although only one data processing center 108 is shown in the example of FIG. 1, persons of ordinary skill in the art will readily appreciate that more than one data processing center 108 may alternatively be employed.

Figure 2:
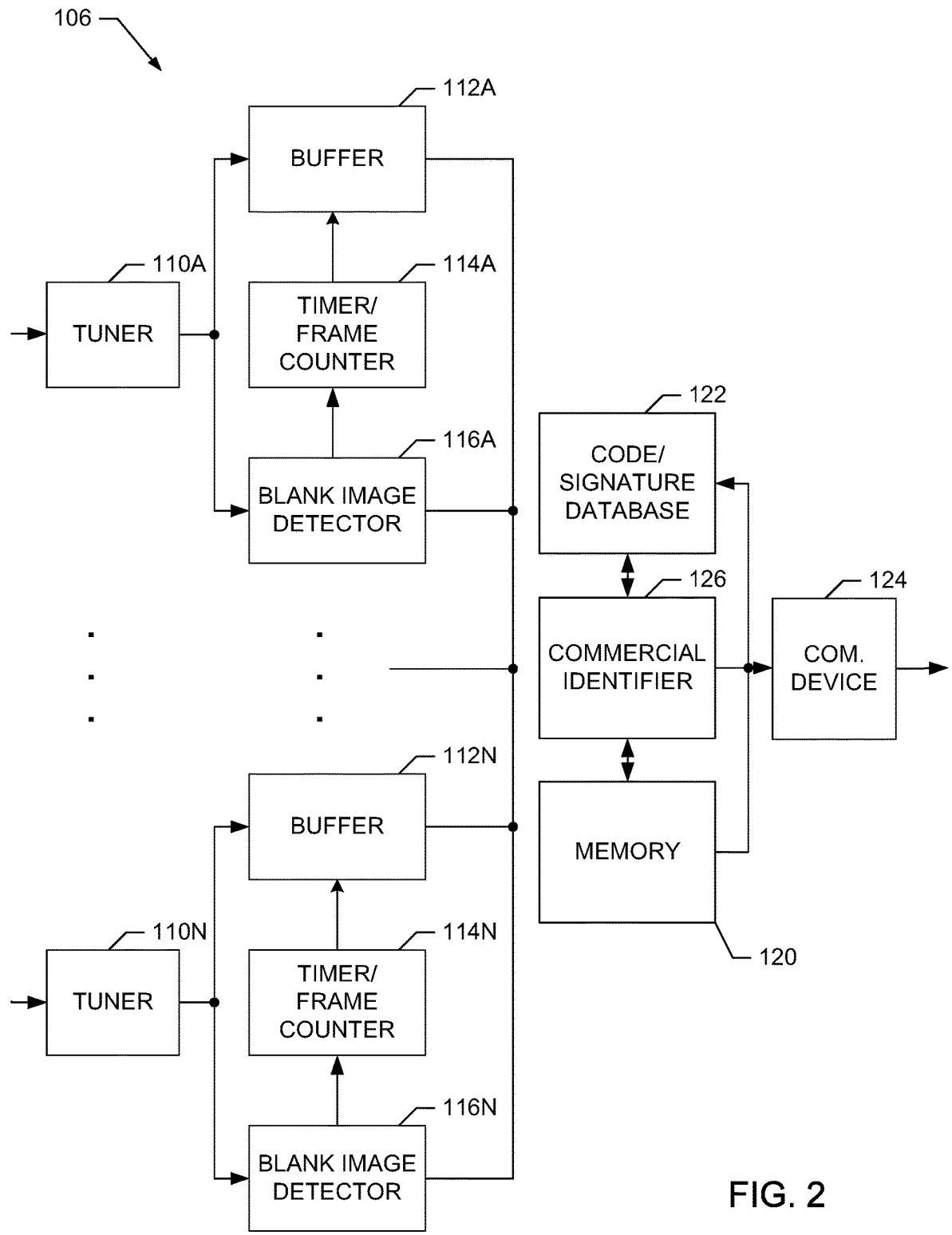
FIG. 2 is a block diagram illustrating an example monitoring station of the system of FIG. 1.

An example monitoring station 106 is shown in FIG. 2. The example monitoring station 106 of FIG. 2 may be used in the system of FIG. 1. To permit the monitoring station 106 to simultaneously monitor a plurality of stations, the monitoring station 106 is provided with a plurality of tuners 110A-110N. Each tuner 110A-110N may be implemented by a conventional tuner and may be supported with conventional signal receiving and conditioning circuitry appropriate for the type of broadcast medium being monitored (e.g., a demodulator, an antennae, a satellite disk, an integrated receiver decoder, a decoder, etc.).

Because, in the illustrated example, the monitoring station 106 is intended to monitor the broadcast of commercials, each of the tuners 110A-110N is provided with a commercial detection system. Each of the commercial detection systems of the illustrated example includes a buffer 112A-112N to delay the signal tuned by the corresponding tuner 110A-110N a time sufficient to determine if it contains one or more commercials or contains content but no commercial, a timer 114A-114N to time intervals occurring between blank images, and a blank image detector 116A-116N to detect the occurrence of blank frames in the signal tuned by the corresponding tuner 110A-110N. The structures and operations of the blank image detectors 116A-116N are described in further detail below. For now, it is sufficient to note that the blank image detectors 116A-116N examine the digital broadcast signals tuned by their respective tuners 110A-110N for blank frames. This examination is preferably performed without decompressing the signal. When a blank frame (or sequence of blank frames) is detected by one of the blank image detectors 116A-116N, that blank image detector 116A-116N starts its corresponding timer 114A-114N and continues monitoring the broadcast signal tuned by its corresponding tuner 110A-110N for the next blank frame (or sequence of blank frames). If the next blank frame (or sequence of blank frames) is detected within a predetermined length of time after the first blank frame (or sequence of blank frames) is detected (e.g., a time period typically associated with a commercial break such as five minutes), the timer 114A-114N associated with the blank image detector 116A-116N detecting the blank frames outputs a signal indicating that the portion of the broadcast signal occurring between the blank frames is a commercial or series of commercials, and the data in the buffer is transferred to a memory for further processing as explained below. If the next sequential blank frame (or sequence of blank frames) occurs more than the predetermined length of time after the first blank frame (or sequence of blank frames) is detected, then the portion of the broadcast signal occurring between the blank frames (or sequences of blank frames) is determined to not be a commercial, and the timer 114A-114N is reset (i.e., restarted) without further processing the contents of the associated buffer 112A-112N. If the buffers are implemented as ring buffers, there is no need to reset the timers or to purge data from the buffers as the data will be automatically overwritten unless exported to the memory for further processing.

When one of the blank image detectors 116A-116N determines that blank image(s) are present in the signal tuned by its corresponding tuner 114A-114N, the portion of the tuned signal stored in the corresponding buffer 112A-112N (which preferably includes approximately 120 seconds before the first blank frame stored in the buffer, 120 seconds after the last blank frame stored in the buffer, and the time between the first and the last blank frame stored in the buffer) is time and date stamped with a clock signal received from a clock and then written to a memory 120. If, on the other hand, the portion of the broadcast signal stored in the buffer 112A-112N is determined not to contain one or more blank frame(s), the data in the buffer 112A-112N is not stored in the memory 120. Persons of ordinary skill in the art will appreciate that the timers/frame counters 114A-114N may be replaced with one or more timers/frame counters in the commercial identifier 126 such that the blank image detectors 116A-116N export the data surrounding a blank image (e.g., 120 seconds before and 120 seconds after the occurrence of a blank frame) whenever a blank image is detected.

Persons of ordinary skill in the art will appreciate that the timers 114A-114N may be implemented in many different ways. However, in the illustrated example, the timers 114A-114N are implemented by frame counters that increment when a new frame is detected.

To enable the monitoring station 106 to automatically identify commercials, the monitoring station 106 is provided with a code/signature database 122. The code/signature database 122 stores unique codes and/or signatures in association with the unique names or identifiers of the associated commercials. The database 122 of each monitoring station 106 preferably stores the commercials likely to be broadcast in the broadcast region in which the monitoring station 106 is located.

To export the data stored in the memory 120 of the monitoring station 106 to a data processing center 108 and/or to update the database 122 with new codes and/or signatures, the monitoring station 106 is further provided with a communication device 124. The communication device 124 may be implemented by any desired type of a communication device such as a modem.

To perform automatic identification of the commercials identified by the monitoring station 106, the monitoring station 106 is further provided with a commercial identifier 126. The commercial identifier 126 operates to extract codes and/or signatures from the time stamped records received by the memory 120 from the buffers 112A-112N and to compare the extracted codes and/or signatures to the codes/signatures stored in the database 122. This comparison can be performed in any conventional fashion. For example, hash code searching may be used to expedite the signature matching process.

Irrespective of the searching/matching techniques employed, if a match is detected, the commercial identifier 126 updates the corresponding record stored in the memory 120 with the identified commercial name or identifier. The corresponding portion of the record has then been identified as containing the corresponding commercial. Because of this conclusive identification, the commercial identifier 126 may replace the code/signature in the corresponding portion of the record stored in the memory 120 with the corresponding commercial name/identifier to, for example, reduce the size of the record.

As will be appreciated by persons of ordinary skill in the art, any or all of the portion of the signal before the first blank frame, the portion of the signal after the last blank frame and the portion of the signal between the first and the last blank frames may contain one or more commercials. Further, in the case of multiple commercials, adjacent commercials may or may not be separated by one or more blank frames. Accordingly, the commercial identifier 126 is preferably adapted to search each record stored in the memory 120 for multiple commercials. This search may be informed, for example, by data such as the length of a commercial already identified in the record. For instance, if a first commercial is identified as occurring immediately after the first blank frame, the first commercial is known from the database 122 to be 30 seconds long, and the time between the first and the last blank frame in the record is 60 seconds, the commercial identifier 126 will attempt to extract one or more codes or signatures from seconds 30-60 of the record occurring between the first and the second blank frames. The extracted code/signature will then be compared to the data in the database 122 to attempt to identify a second commercial in the record. If no match is found, the record will be marked for further processing (e.g., via automatic matching against a larger code/signature database and/or human viewing) to identify any additional commercial(s) in the record. If a match is found, the record is updated with the matching commercial name or identifier and, if appropriate, the search for additional commercials in the record continues.

By way of additional examples, one or more commercials may occur before the first blank frame or after the last blank frame. Accordingly, the commercial identifier 126 preferably attempts to extract codes and/or signatures from the portion of the record occurring before the first blank frame and after the last blank frame. The extracted codes and/or signatures are then compared to records from the database 122 in a conventional fashion as explained above. If a match is found, the matching commercial name or identifier is placed in the record as explained above. If no match is found, the record may be marked for further processing by the central facility 108.

As mentioned above, the communication device 124 may be used to transfer data to and/or from the monitoring station 106. For example, the communication device 124 may be used to periodically update the code/signature database 122 with new codes/signatures identified at the central facility 108. Additionally, the communication device 124 may be employed, for example, to periodically export those records collected in the memory 120 that have been processed by the commercial identifier 126 to the data processing center 108. For example, the communication device 124 may be actuated to export the data/records when the memory 120 reaches a predetermined level of fullness, to export the data at predetermined time(s), and/or to export the data at predetermined time intervals.

The example monitoring station 106 of FIG. 2 is structured to identify blank video images from compressed digital video information. The blank video images may be detected without unpacking/uncompressing the digital video information, thereby achieving blank frame detection more quickly and with less decoding overhead than is required by prior art systems. Before discussing the example monitoring station 106 in further detail, a brief discussion relating to digital video signal compression is given below to provide a context for understanding the operation of the monitoring station.

The following discussion is based primarily on the Moving Pictures Expert Group (MPEG) video compression standard. The MPEG standard is one particularly well-known digital video compression standard that may be used in conjunction with the example methods and apparatus described herein. However, MPEG video compression techniques are only one particular example manner in which digital video information may be compressed for use with the example methods and apparatus disclosed herein. Therefore, those having ordinary skill in the art will appreciate that the example apparatus and methods disclosed herein may be similarly applied in conjunction with other digital video compression schemes.

In general, video compression schemes operate based on the assumption that video sequences or programs typically contain a relatively large amount of temporally and/or spatially redundant information. Temporal redundancy occurs between successive frames or images making up a video sequence because there are relatively few changes to the color and brightness of large portions of the successive images or frames making up the video sequence. On the other hand, spatial redundancy occurs within a given video frame or image because adjacent pixels or areas within an image or frame are often of the same or similar color and intensity or brightness. Thus, by eliminating temporally and spatially redundant video information from a video program prior to its transmission, the amount of bandwidth required to transmit the video program can be reduced dramatically.

The data reduction achieved by a compression scheme is commonly expressed as a compression ratio. Compression ratios are usually calculated by dividing the amount of video data making up an original sequence of video images by the amount of compressed data used to transmit that video data. Compression ratios of between about 10:1 and about 100:1 are commonly achieved using an MPEG-based video compression scheme.

Video compression schemes also typically eliminate certain types and amounts of video information that is not necessarily redundant, but which, if eliminated, is not perceptibly noticeable or offensive to the human eye. For example, the human eye is significantly more sensitive to variations in brightness than variations in color or hue. As a result, video compression schemes often reduce the amount of digital information pertaining to color or hue without adversely impacting the perceived quality of an image extracted from compressed image information. In addition, the human eye has greater difficulty perceiving rapid variation of brightness and/or color, shade or hue across an image (i.e., the higher frequency components that compose an image). As a result, video compression schemes can zero-out or eliminate the transmission or processing of the higher frequency components of an image without adversely impacting the perceived quality of the image.

Figure 3:
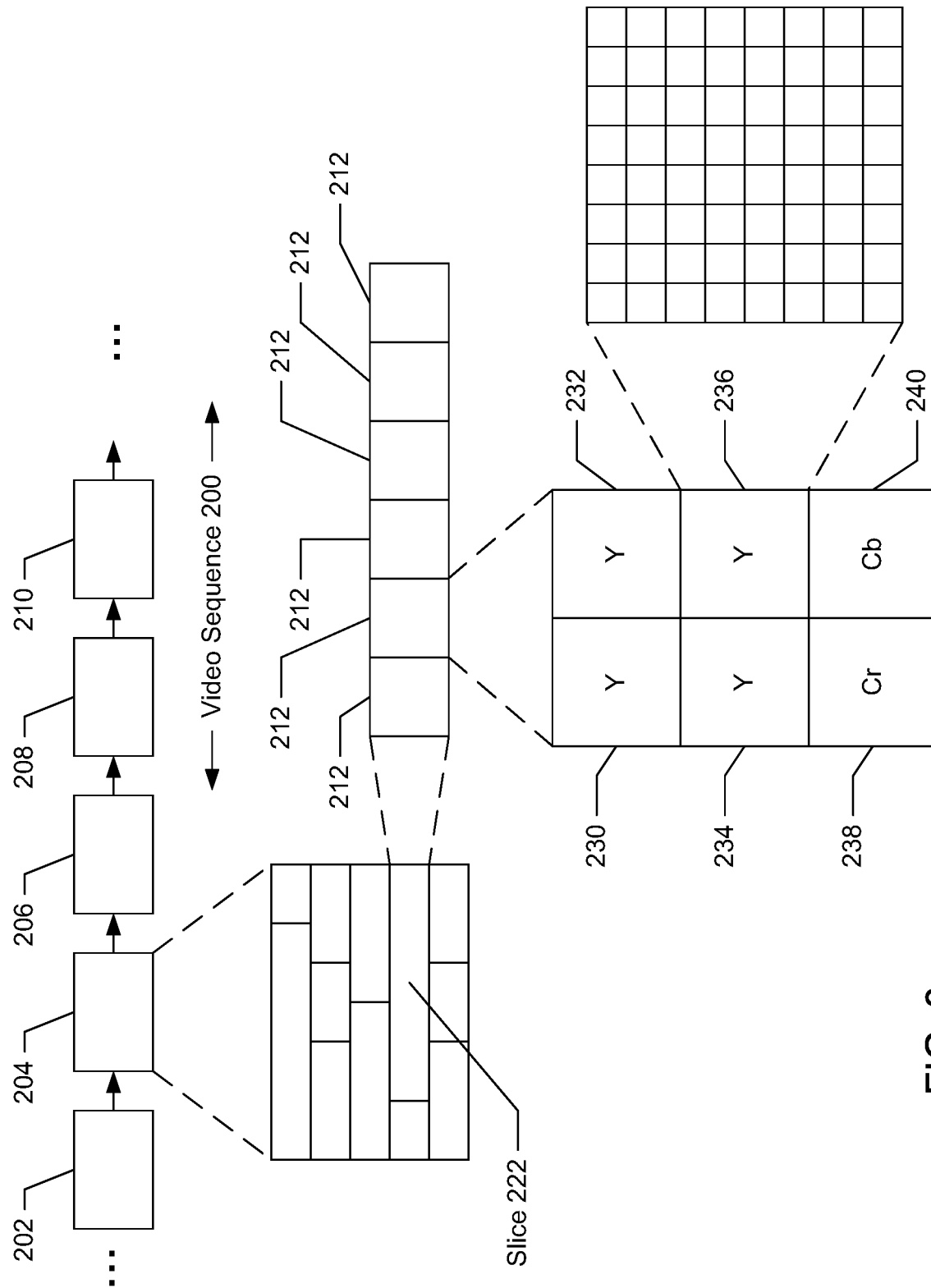
FIG. 3 is a block diagram illustrating the MPEG encoding scheme.

FIG. 3 depicts an example sequence 200 of digital video images or frames 202, 204, 206, 208 and 210 that may be associated with a digital television program or the like. The images or frames 202-210 may make up a group of pictures (GOP) for purposes of MPEG encoding (i.e., compression) to be transmitted, stored or otherwise conveyed for use by an MPEG decoder associated with an output device (e.g., a television, video monitor, computer screen, etc.)

Initially, each of the images or frames 202-210 is composed of uncompressed digital information representing display pixels arranged in a plurality of rows and columns to be displayed on an output device in a particular format at a particular rate. For example, each of the frames 202-210 may contain sufficient pixel information to display an image or a frame on a raster scan-based display having 480 rows or lines of 720 pixels (i.e., columns). Displaying a sequence of frames at, for example, a rate of 30 frames per second may create the impression of a smoothly moving video image. Of course, many other display formats and rates could be used instead.

The amount of digital data required to represent each pixel within each of the frames or images 202-210 depends on the color model used to create the images 202-210. For example, if the well-known Red, Green, Blue (RGB) color model is used, eight bits are used to represent the amount of each image or color component used for each pixel. Thus, for a digital image generated using the RGB color model, a total of twenty-four bits of data are required to represent each pixel.

During the MPEG compression processes, each of the images or frames 202-210 is sub-divided into a sequence of macro blocks 212. The macro blocks 212 are grouped into slices 222 such that each frame 202-210 comprises a plurality of slices 222 and each slice 222 comprises a plurality of macro blocks 212 as shown in the example of FIG. 3. Each macro block 212 is composed of 16×16 pixels (i.e., sixteen rows of sixteen pixels). The resulting sequences of macro blocks 212 are maintained in a raster scan order. By way of example, the image or frame 204 is sub-divided into slices 222 of macro blocks 212, each of which includes RGB data for 16×16 or 256 pixels.

The MPEG compression process converts the RGB data (i.e., the twenty-four bits of information) for each pixel within the macro blocks 212 into the well-known YUV color model. In general, the YUV color model represents each pixel using a luminance value denoted as Y and two chrominance values denoted as Cr and Cb. However, because the human eye is significantly less sensitive to color changes, the MPEG compression process decimates the chrominance information for each of the macro blocks 212 via a horizontal and vertical (i.e., row and column) sub-sampling process. In particular, the decimation process averages the chrominance information (i.e., the Cr and Cb values) for groups of four pixels arranged in two rows and two columns, discards the individual chrominance values making up the averages and retains the average values. In this manner, the MPEG compression process compresses the chrominance information required to display an image by a factor of four without adversely affecting the perceptible quality of the image when displayed to a human.

By way of example, following the color model conversion and chrominance decimation processes, a macro block 212 includes four 8×8 luminance blocks 230, 232, 234 and 236 and two 8×8 chrominance blocks 238 and 240. Together, these luminance blocks 230-236 and chrominance blocks 238-240 represent the color and intensity of the group of 16×16 pixels associated with the corresponding macro block 212. Each of the blocks 230-240 is composed of eight rows and eight columns of eight bit values (i.e., bytes). For example, the luminance block 236 is composed of a grid where each of the squares of the grid represents an eight bit luminance value associated with a particular pixel within the macro block 212. Of course, because the chrominance information has been decimated as described above, each of the eight bit values within the 8×8 chrominance blocks 238 and 240 represents the average color information for a group of four pixels associated with the corresponding macro block 212.

After converting the color model and decimating the chrominance information, the MPEG compression scheme processes the images or frames 202-210, which are now represented using the decimated YUV data, to eliminate or reduce temporal redundancy. The MPEG compression scheme uses motion-compensated inter-frame prediction to reduce the amount of data required to regenerate a sequence of video frames. In general, the MPEG compression scheme periodically generates reference frames (known as Intraframes or I-frames) that are substantially still video images that can be regenerated (i.e., displayed) without reference to any other frames or images. A series of video frames preceding and/or following a reference frame or I-frame are either Predictive-frames (commonly known as P-frames) or Bidirectionally predictive-frames (commonly known as B-frames). P-frames may contain motion vectors and error information relating the P-frame to an I-frame or to one or more preceding P-frames, while B-frames may contain motion vectors and error information relating to preceding and/or subsequent I-frames or P-frames. Because substantial portions (e.g., a background) of a video image typically do not change significantly (or at all) from one frame to the next (i.e., there is a significant amount of temporal redundancy), the amount of information needed to represent each P-frame and B-frame can be significantly less than the amount of information needed to represent an I-frame.

During an MPEG compression process, each of the frames or images 202-210 comprising the video sequence 200 are designated by the MPEG encoder as one of an I-frame, a P-frame or a B-frame. The relatively complex manner in which the MPEG compression process designates frames as I-frames, P-frames and B-frames is well-known in the art and is not described in further detail herein.

Once the MPEG compression process has reduced or eliminated temporally redundant inter-frame information by converting a sequence of video images into a sequence of I-frames, P-frames and B-frames, the MPEG compression scheme processes these frames to remove spatial redundancy. The MPEG compression scheme recognizes that within a given 16×16 pixel macro block 212 there is typically a repeatable pattern of pixel information and/or the pixel information does not vary significantly (e.g., perceptibly) across the macro block.

Figure 4:
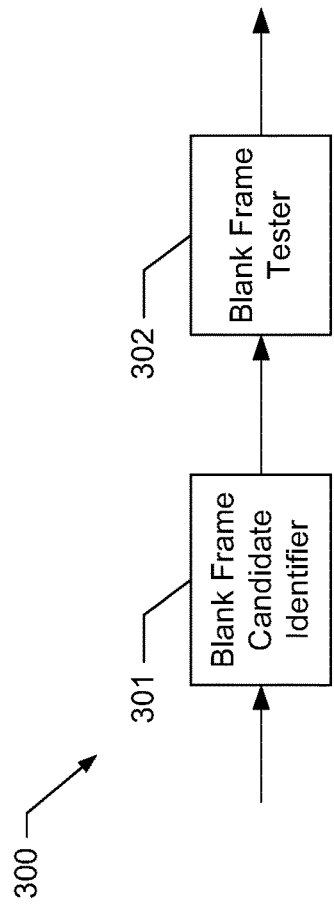
FIG. 4 is an example luminance block of a macro block shown in the frequency domain.

To eliminate the spatially redundant information, the MPEG compression scheme uses a discrete cosine transform (DCT) to convert each of the 8×8 blocks 230-240 comprising the macro blocks 212 of the I-frames, P-frames and B-frames from the spatial domain into the frequency domain. In the spatial domain, each square (i.e., byte) within an 8×8 luminance block 230-236 corresponds to a physical pixel location (or in the case of a chrominance block 238, 240, each square (i.e., byte) corresponds to four pixel locations), whereas in the frequency domain, each square within the 8×8 block produced by the DCT conversion corresponds to a frequency of a cosine waveform representing a frequency component of the pixel data. Because there is typically very little variation in intensity and color across a 16×16 pixel macro block 212, most macro blocks 212 can be represented in the frequency domain using a direct current (DC) component (i.e., a zero frequency component or offset) and few, if any, low frequency (AC) components. As is well known, the DCT of an 8×8 luminance block 230-236 of spatial pixel information (e.g., an 8×8 block of luminance information where each square within the block 230-236 represents an eight bit value associated with a physical pixel location) results in an 8×8 block of frequency domain information, where each square contains an amplitude coefficient for a cosine waveform of a particular frequency (see the example grid of FIG. 4 showing the luminance block 236 in the frequency domain). The block 250 in the upper left corner of the frequency domain grid 236 is a DC value (e.g., the average luminance for the 8×8 spatial domain block 236). The values in the grid squares other than the upper left corner block 250 represent AC values. The horizontal frequency of these AC values increase as one moves across rows to the right of the upper left corner block 250 and the vertical frequency of these AC values increase as one moves down columns in the grid 236.

In practice, performing a DCT and quantization on each of the 8×8 blocks 230-240 results in frequency domain blocks having relatively few coefficient values near the upper left corner of the 8×8 frequency domain blocks 230-240 and a relatively large number of zero or near zero coefficients in the majority of the AC squares making up the remainders of the blocks 230-240. Therefore, by using a run-length encoding scheme and not individually transmitting the zero and near zero frequency domain coefficients, the MPEG compression process can substantially reduce the amount of data needed to reconstitute the compressed image without perceptibly degrading the image quality.

To illustrate the manner in which spatially redundant information can be eliminated, consider an 8×8 block of pixel luminance information such as, for example, the block 236 of FIG. 3. If the luminance is constant (e.g., a digital value of 128) across the block 236, each of the luminance values associated with the 64 squares making up the grid will contain the value 128. Performing a DCT on such an 8×8 luminance block will result in an 8×8 luminance block (see FIG. 4) in which the upper left corner square 250 contains the DC value 128 and all other squares or frequency domain coefficients are equal to zero (i.e., because the luminance is constant, there are no AC components). Taking advantage of this scheme, instead of transmitting all 64 values, run length encoding transmits only four numbers to represent the luminance values for all of the pixels associated with the original 8×8 spatial domain block 236. In other words, all 64 luminance values do not have to be transmitted and processed by an MPEG decoder. Instead, using the run-length encoding scheme, only four values (e.g., 001 128 063 000) are transmitted to the MPEG decoder.

In general, the MPEG compression process achieves relatively high compression ratios by employing techniques such as, for example, frequency coefficient quantization (e.g., reducing the number of bits needed or allocated for each frequency domain coefficient), and zigzag sequence coding in conjunction with run-length encoding to eliminate the individual transmission of coefficients having a same value. Such techniques are well-known in the art and, thus, are not discussed further herein.

It should be noted, however, that a further compression is performed when encoding a macro block 212. In particular, the first luminance block 230 in a macro block 212 includes an absolute DC value in its upper left hand square 250. The DC values of the remaining luminance blocks 232-236 are relative DC values reflecting any difference between the DC value associated with the corresponding luminance block 232-236 and the absolute DC value stored in the first luminance block 230. Therefore, if the luminance is constant across all of the luminance blocks 232-236 in a macro block 212, all of the luminance blocks 230-236 in the macro block 212 may be differential encoded to reflect the single DC luminance value (i.e., the absolute DC value from the first luminance block 230) and the following zero values.

An additional encoding method deserves mention here. In particular, in the MPEG II protocol, an entropy encoding scheme is used to reduce the number of bits required to transmit data. In the MPEG II entropy encoding scheme, statistical studies are used to develop a look up table associating values with codes. The most frequently used codes (as indicated by the statistical studies) are assigned the shortest codes to reduce the number of bits typically required to transmit data. If such an encoding scheme is used, the blank image detectors 116A-116N should be provided with access to the codes (e.g., to the look-up table) to enable proper interpretation of the data in the macro blocks. In other words, irrespective of the coding scheme employed, the blank image identifiers 116A-116N should be informed of the coding scheme to properly analyze the broadcast stream.

Figure 5:
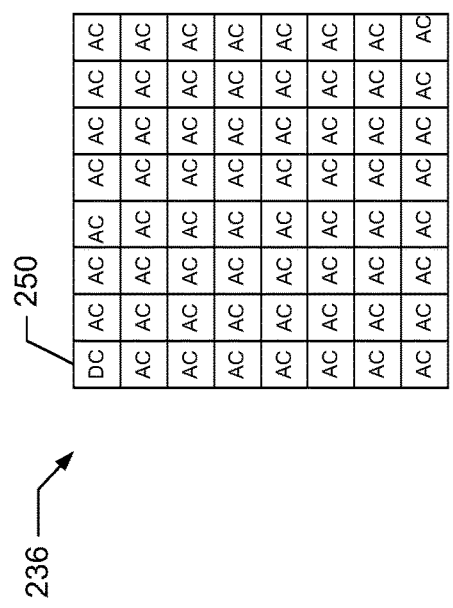
FIG. 5 is a block diagram illustrating an example blank image detector.

A block diagram of an example blank image detector 300 is illustrated in FIG. 5. In the illustrated example, the blank image detector 300 includes a blank frame candidate identifier 301 and a blank frame tester 302. As explained in detail below, the blank frame candidate identifier 301 examines the total number of bits or bytes in a frame to determine if the frame has a data size small enough to potentially be a blank frame. If so, the blank frame candidate identifier 301 examines predetermined areas of the frame (e.g., rows, groups of rows, etc.) to determine if more than a predetermined number of the areas include substantially the same number of bytes or bits of data. If either of these thresholds are not met, the blank image detector 300 concludes that the associated frame is not blank and proceeds to analyze the next frame. If, however, the frame has a sufficiently small data size and more than the predetermined number of areas in the frame include substantially the same number of bytes or bits of data, the frame may be a blank frame. Accordingly, the blank frame tester 302 examines the candidate frame (i.e., the frame identified by the blank frame candidate identifier 301 as having a sufficiently small data size and more than the predetermined number of areas with substantially the same number of bytes or bits of data) to determine if it is a blank frame.

In the illustrated example, the blank frame candidate identifier 301 takes advantage of the fact that blank images are low complexity images. As such, blank images contain a small amount of data and have a substantially constant bit or byte allocation distribution such that equal sized and shaped areas of the blank image are represented by substantially the same relatively low number of bits or bytes. Therefore, any image that has too many bits/bytes or has a complex bit or byte allocation distribution is too complex to be blank and can be immediately discarded as a non-blank image without conducting a more detailed examination of the frame.

In the illustrated example, the blank frame tester 302 determines if the candidate frame is blank by examining the DC values of the luminance blocks in one predetermined area (e.g., in one slice) of the frame. In particular, the example blank frame tester 302 of FIG. 5 identifies blank images by counting entropy codes representing zero in the DC values in the luminance blocks 230-236 of a slice of the frame in question, and by determining if the number of DC values containing entropy codes representing zero (i.e., no change) exceeds a threshold. If that threshold is exceeded, the blank frame tester 302 identifies the frame as a blank frame. If the threshold is not exceeded, the blank frame tester 302 identifies the frame as a non-blank frame. In the illustrated example, both the blank frame candidate identifier 301 and the blank frame tester 302 operate on the frames without decoding the same.

Figure 6:
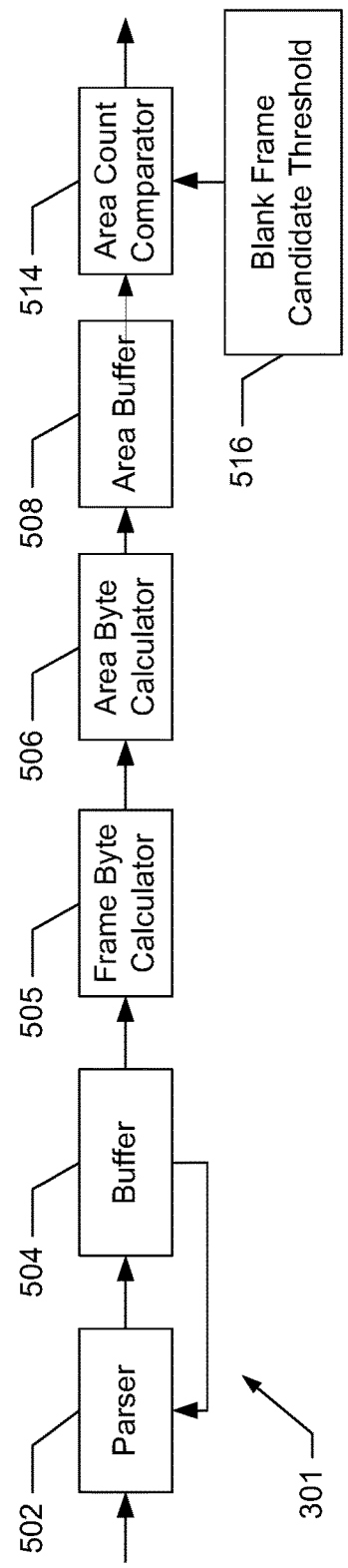
FIG. 6 is a block diagram illustrating an example blank frame candidate identifier.

An example blank frame candidate identifier 301 is illustrated in FIG. 6. The example blank frame candidate identifier 301 of FIG. 6 identifies a blank frame candidate by counting or calculating the number of bits or bytes contained in a frame and, if the bit/byte count for the frame is sufficiently low, by counting the number of bits or bytes in predetermined areas comprising the frame. The predetermined areas are preferably non-overlapping areas that cover the entire frame. For example, the predetermined areas may be rows of the frame or blocks of rows of the frame. In the illustrated example, each of the predetermined areas is a block of sixteen rows. If a predetermined percentage of the areas in a frame have substantially the same number of bytes, each areas of the frame exhibits substantially the same complexity and the frame is, thus, identified as a blank image candidate.

In the illustrated example, the blank frame candidate identifier 301 includes a parser 502, a buffer 504, a frame byte calculator 505, an area byte counter 506, an area buffer 508, an area count comparator 514, and a blank frame threshold 516 interconnected as shown.

Figures 7, 8:
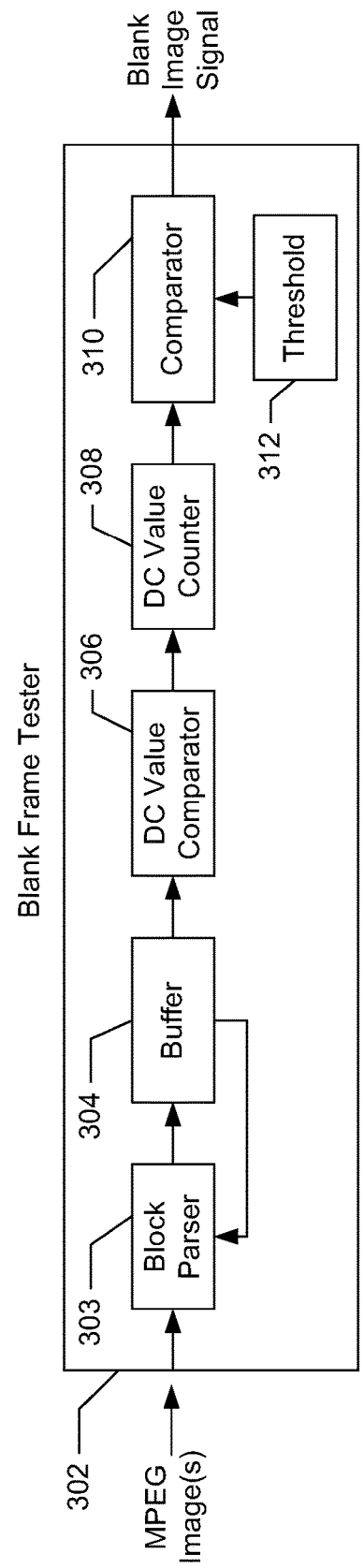
FIG. 7 is an example slice table.
FIG. 8 is a block diagram illustrating an example blank frame tester.

As will be appreciated by persons of ordinary skill in the art, to enable interpretation of a broadcast stream of digital data, various synchronization codes are embedded in the stream. For example, a code or mark is inserted to identify the start of every frame and the beginning of every slice in a frame. The parser 502 takes advantage of the presence of these codes to populate a slice address table 520 as shown in FIG. 7. In particular, without decoding the frames, the parser 502 responds to the start of each new frame by recording the slice vertical position or row address and start address of each slice in the slice table 520. These addresses identify the physical locations of the slices in the memory buffer. The table 520 may be implemented in any desired fashion. Persons of ordinary skill in the art will appreciate that the address values shown in FIG. 7 are simplified for purposes of illustration.

The buffer 504 stores one or more video frames 202-210 to save the context for the commercial identifier 126. The buffer 504 may be any type of memory device. For example, the buffer 504 may be static random access memory (SRAM), dynamic random access memory (DRAM), flash memory, magnetic memory, etc.

After or as the parser 502 completes the table 520, the frame byte calculator 505 calculates the number of bits or bytes contained in the frame. If the number of bits/bytes in the frame exceeds a predetermined threshold, the frame is too complex to be blank, and, thus, the blank frame candidate identifier 301 discards the frame as non-blank. If, however, the byte count of the frame (for example, as reflected by the addresses in the table 520) does not exceed the threshold, the frame may be blank. Accordingly, the area byte calculator 506 calculates the number of bytes contained in each of the predetermined areas of the subject frame. In particular, the area byte calculator 506 analyzes the table 520 to calculate how many bytes are in each of the areas. In the illustrated example, each of the predetermined areas is a row of the frame. As used herein, in the MPEG context, the term "row" refers to a stack of sixteen display rows. For instance, in the example of FIG. 7, the start address of the first slice in row 2 is 1001 and the start address of the first slice in row 1 is 1. Therefore, row 1 includes 1000 bytes (i.e., 1001−1=1000).

In some instances, a row may contain more than one slice. Since the area byte calculator 506 is seeking to determine the number of bytes per row, it effectively combines slices occurring on the same row by calculating the difference between the start address of the first slice on a given row and the start address of the first slice on the next row following the given row. Looking at a more concrete example, in FIG. 7, two slices are located on row 2. Therefore, to calculate the number of bytes on row two, the area byte calculator 506 subtracts the start address of slice 2 (i.e., the first slice on row 2) from the start address of slice 4 (i.e., the first slice on row 3). This calculation reveals that row 2 contains 1000 bytes (i.e., 2001 (the start address of slice 4)−1001 (the start address of slice 2)=1000).

The area byte calculator 506 writes the number of bytes it calculates for each row into the area buffer 508 for further processing. The area buffer 508 may be implemented in any desired fashion. For example, it may be implemented like the buffer 504.

When the area buffer 508 is filled with the data for each area of a frame, the area count comparator 514 analyzes the area byte counts stored in the area buffer 508 to determine if each of the areas contains substantially the same number of bytes. If each of the areas contains substantially the same number of bytes, than the frame is a blank frame candidate.

The area count comparator 514 may analyze the area byte counts in any of a number of manners. For example, the area count comparator 514 may discard the lowest 10% and the highest 10% of the area byte counts stored in the area buffer 508, and then calculate the standard deviation of the remaining area byte counts. Once the standard deviation is computed, the area count comparator 514 may compare the standard deviation to a blank frame candidate threshold 516. If the standard deviation is greater than the blank frame candidate threshold, then the frame is not a blank frame. Otherwise, if the standard deviation is less than the blank frame candidate threshold 516, the blank frame candidate identifier 301 identifies the frame as a blank frame candidate.

The blank frame candidate threshold value 516 may be set to any desired value. For example, it may be set to correspond to a standard deviation indicating that the number of bytes in the middle 80% of the areas of a frame vary by less than any desired number of bytes.

When the blank frame candidate identifier 301 identifies a blank frame candidate, the blank frame tester 302 is activated to determine whether the blank frame candidate is indeed a blank frame. Whereas the blank frame candidate identifier 301 utilizes tests that err on the side of identifying some non-blank frames as blank frame candidates, the blank frame tester 302 utilizes a more precise test to determine if a blank frame candidate identified by the blank frame candidate identifier 301 is in fact a blank frame. This multi-level testing process is performed for increased processing efficiency and to exclude frames from the pool of blank frame candidates that would falsely be identified as blank by the blank frame tester 302. Efficiency is improved in that most frames are not blank frames and, thus, can be excluded as non-blank frames based on their overall data size (i.e., total bit or byte count) and/or on their bit or byte allocation distribution without conducting a more detailed examination of the frame. False identification of non-blank frames as blank is avoided in instances where, a complex image (i.e., a non-blank image with a relatively large byte allocation) exhibits a substantially constant average brightness. The blank frame tester 302 might incorrectly identify such frames as blank if they are not excluded on the size test by the candidate identifier 301.

In the illustrated example, the blank frame tester 302 performs its test on one area (e.g., one slice) of the blank frame candidate. If the tested slice of the blank frame candidate indicates that the candidate is indeed a blank frame, the blank frame tester 302 identifies the blank frame candidate as a blank frame. Any slice in the blank frame candidate may be tested by the blank frame tester 302. However, it is preferable that the slice not be located in one of the rows discarded by the blank frame identifier 301 in developing the standard deviation value noted above (i.e., the slice should not be located in one of the rows in the top 10% of byte counts or one of the rows with the lowest 10% of byte counts. Persons of ordinary skill in the art will appreciate that, although the illustrated blank frame tester 302 examines only one slice, more than one slice (e.g., all of the slices in a frame or less than all of the slices in a frame) may alternatively be examined.

An example blank frame tester 302 is illustrated in FIG. 8. In the illustrated example, the blank frame tester 302 includes a block parser 303, a buffer 304, a DC value comparator 306, a DC value counter 308, and a comparator 310 interconnected as shown. As mentioned above, the blank frame tester 302 analyzes one of the slices in a blank frame candidate to determine if the candidate frame is indeed a blank frame.

The parser 303 may be any type of parser. In the illustrated example, the parser 303 receives an MPEG blank frame candidate from the blank frame candidate identifier 301 and unpacks the digital data in a selected slice of the blank frame candidate into a plurality of luminance blocks 230-236. However, the parser 303 need not uncompress the selected slice. Once the digital data in the selected slice is unpacked, the parser 303 stores the luminance blocks 230-236 from that slice in the buffer 304. Persons of ordinary skill in the art will appreciate that the parser 303 may be structured to operate in accordance with MPEG or video compression standards other than MPEG.

The buffer 304 may store one or more video frames 202-210 as well as the plurality of luminance blocks 230-236 corresponding to the selected slice of the blank frame candidate. The buffer 304 may be any type of memory device. For example, the buffer 304 may be static random access memory (SRAM), dynamic random access memory (DRAM), flash memory, magnetic memory, etc.

Figure 9:
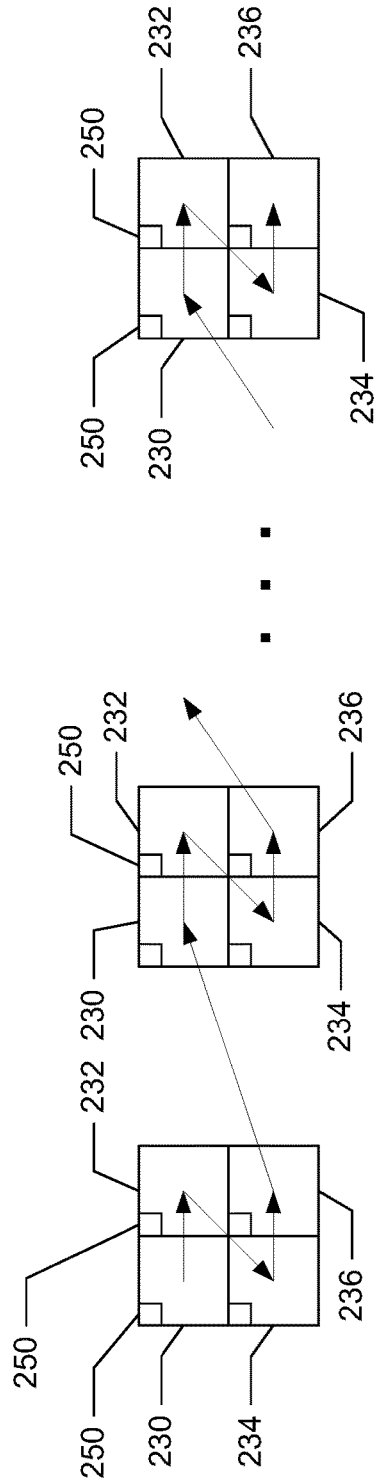
FIG. 9 is an illustration of an example order in which the blank image detector reviews the luminance blocks of a series of macro blocks.

As described in detail above, each luminance block 230-236 holds a DC value in its upper left hand square 250 and those DC values are indicative of the average brightness for the corresponding luminance block 230-236. The DC value comparator 306 of the example of FIG. 8 retrieves and compares the DC values of each sequential pair of luminance blocks 230-236 in the selected slice. As shown in FIG. 9, "sequential pairs of luminance blocks" are defined by a zigzag processing pattern. In particular, the DC value comparator 306 first compares the DC values from the first and second luminance blocks 230 and 232 of a first macro block, then compares the DC values from the second and third luminance blocks 232 and 234 of the first macro block, then compares the DC values from third and last luminance blocks 234 and 236 of the first macro block, and then compares the DC value from the last luminance block 236 of the first macro block and the DC value from the first luminance block 230 of a next macro block. This examination pattern is repeated until all of the luminance blocks in all of the macro blocks of the selected slice have been examined. Persons of ordinary skill in the art will appreciate that, because all of the DC values in a slice besides the first DC value in that slice are typically relative values, "comparing DC values" in the case of an absolute DC value followed by a relative DC value simply comprises reading the relative DC value since the relative DC value is inherently the result of a comparison between the absolute DC value of the previous block and the absolute value of the following block.

The DC value comparator 306 compares the DC values of the sequential pairs of luminance blocks 230-236 to determine if there is a difference in average brightness between the pair of luminance blocks. If no change is detected (e.g., the compared DC values are substantially identical), the DC value comparator 306 outputs a no change signal (e.g., a logic high signal). Because noise can cause some unintended brightness changes, the DC comparator 306 may be structured to output the no change signal whenever the difference between the compared DC values is zero or within a predetermined range of zero.

The output of the DC value comparator 306 is communicated to the DC value counter 308. The DC value counter 308 increments in response to every no change signal received from the DC value comparator 306. The DC value counter 308 is re-set to zero whenever examination of a new slice begins.

The comparator 310 compares the value stored in the DC value counter 308 to a predetermined threshold value 312. If the DC value counter 308 counts more than the threshold value 306 of no change signals from the DC value comparator 306, the comparator 310 outputs a blank image signal indicating that the examined blank frame candidate is a blank frame. The predetermined threshold value 312 may be set to any desired value. For example, it may be set to correspond to a number equivalent to any desired percentage of the total number of luminance blocks 230-236 contained in a slice (e.g., 51%, 90%, etc.).

Figure 8A:
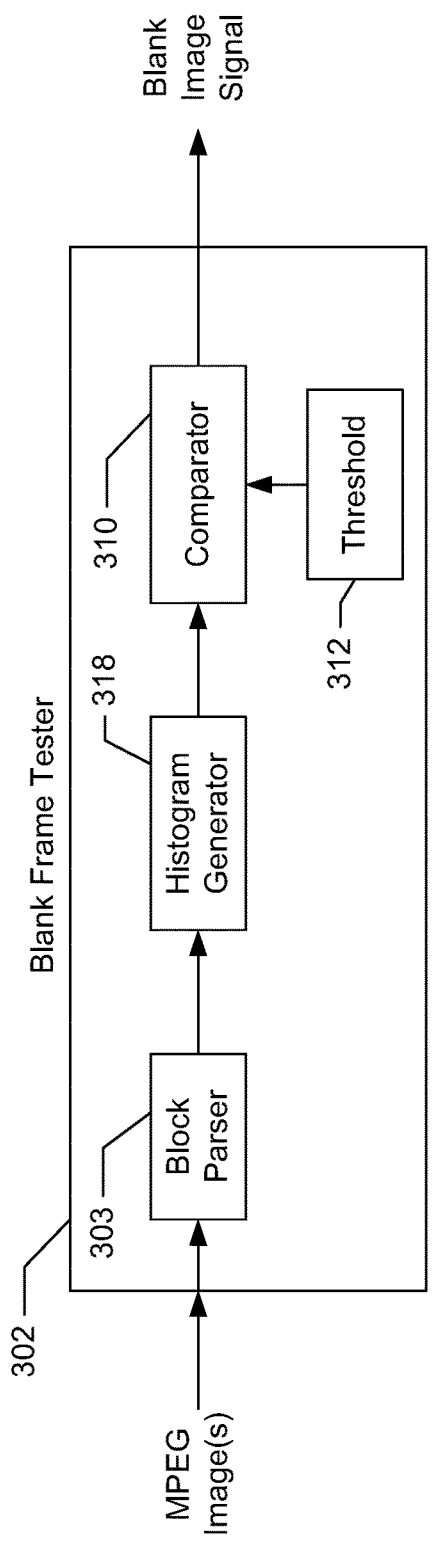
FIG. 8A is a block diagram illustrating another example blank frame tester.

In a preferred alternative example illustrated in FIG. 8A, the buffer 304, the DC value comparator 306 and the DC value counter 308 are eliminated and replaced with a histogram generator 318. The histogram generator 318 receives the DC values for a given slice from the parser 303 and creates a histogram reflecting the DC values counted in the slice. For example, a DC value of 0 is reflected in the histogram (e.g., by a unit block or line) at a position indicative of 0, a DC value of 1 is reflected in the histogram at a position indicative of 1, etc. After all of the DC values in the slice have been recorded in the histogram, the histogram is examined by the comparator 310 to determine if the slice is a blank slice. The histogram of a blank slice should exhibit a peak at a single value indicating substantially constant brightness. The histogram should be zero at all other DC values if the slice is a blank slice. However, because of noise, there may be shorter peaks around the tallest peak. Accordingly, the comparator 310 sums the peak heights for a window of values around the largest peak value. If the summed value exceeds a threshold 312, the blank frame tester 302 identifies the frame as a blank frame. Otherwise, the frame is not blank and is discarded.

Stated more precisely, if we let: (a) H[i] be a histogram, where i=0, . . . , 255; (b) p=arg max H[i], where i=0, . . . , 255 (i.e., p is a number such that H[p]>=H[i] for all i), (c) s=Sum(H[i]) for i from p-w to p+w, where w is the window width, (e.g., 5), and (d) S=Sum(H[i]), where i=0, . . . , 255, then if (s/S>threshold), the frame is blank, where threshold is, for example, 95%.

Persons of ordinary skill in the art will appreciate that, although in the preferred examples described above, the blank frame identifier 300 is implemented as a two stage device including a blank frame candidate identifier 301 and a blank frame tester 302, other implementations are likewise appropriate. For example, if a less precise blank frame identifier 300 is acceptable, the blank frame identifier 300 may be implemented to exclude the blank frame tester 302 such that blank frame candidates identified by the blank frame candidate identifier 301 are all accepted as blank frames. In such an approach, it may be desirable to tighten the standard for identifying blank frame candidates by, for example, permitting less variance in byte length from area to area (e.g., row to row) in a frame identified as blank.

As another alternative, the blank frame identifier 300 may be implemented to exclude the blank frame candidate identifier 301 such that the blank frame tester 302 tests every frame to determine if it is a blank frame. In such an approach, it is desirable to have the blank frame tester 302 examine the DC values in the luminance blocks in more than one slice of the frame to determine if the corresponding frame is indeed blank. For example, the blank frame tester 302 may examine all of the luminance blocks in a frame, or the luminance blocks of a predetermined number of slices in the frame (which may be all of the slices in the frame or less than all of the slices in the frame).

Figure 10A:
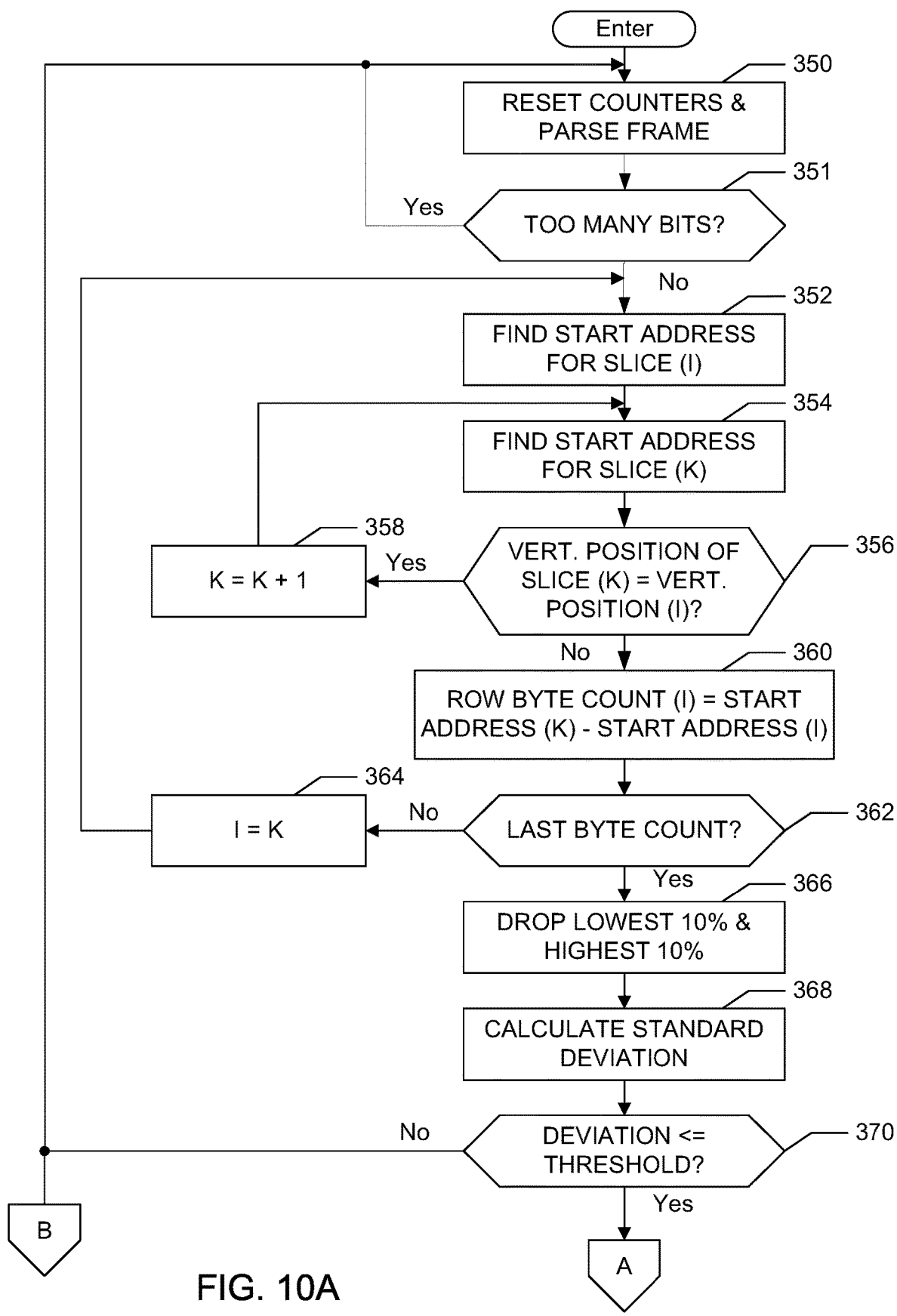
FIGS. 10A-10C are a flowchart representative of machine readable instructions which may be executed to implement the example blank image detectors of FIGS. 8 and/or 8A.
Figure 10B:
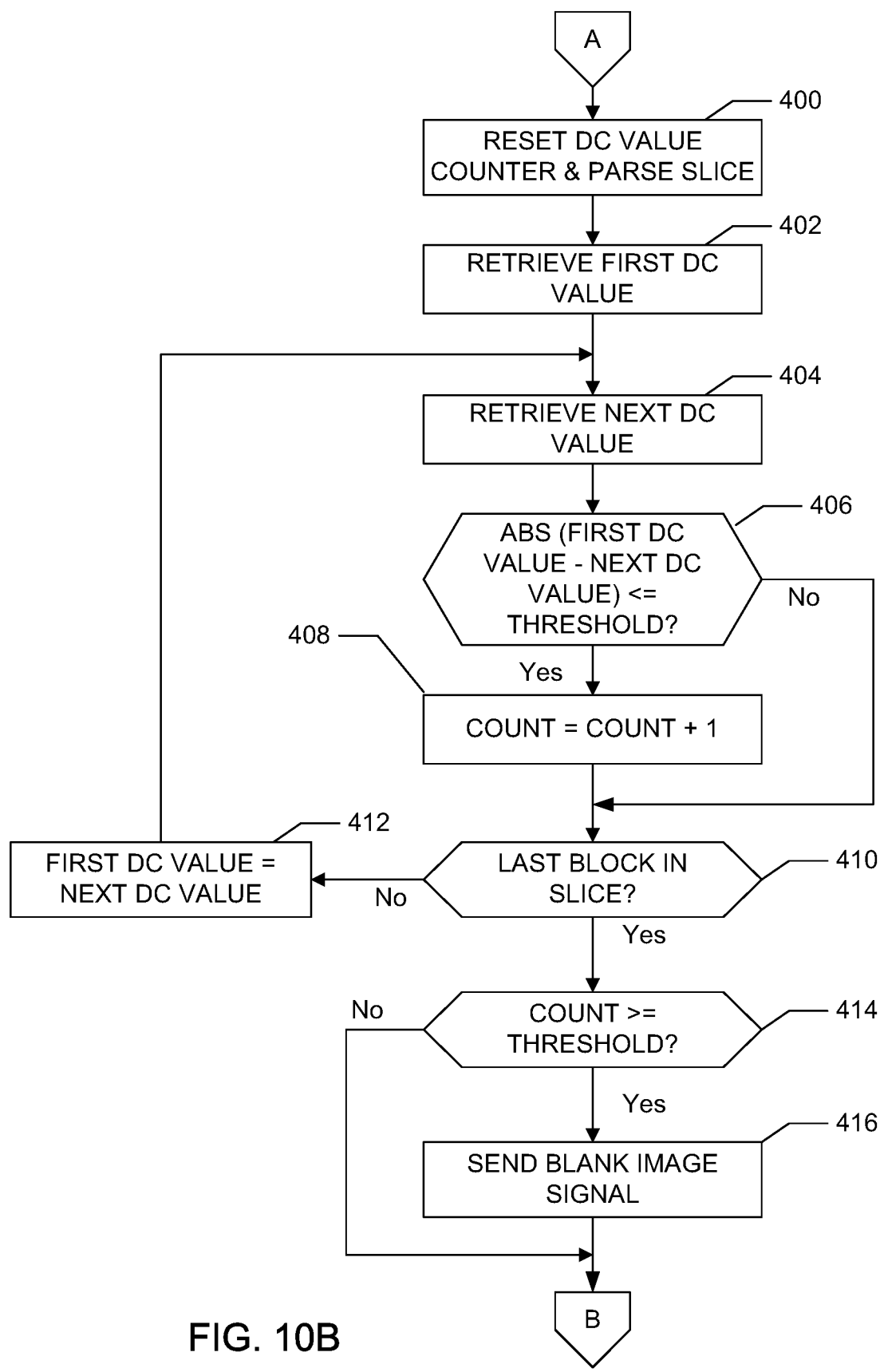
Figure 10C:
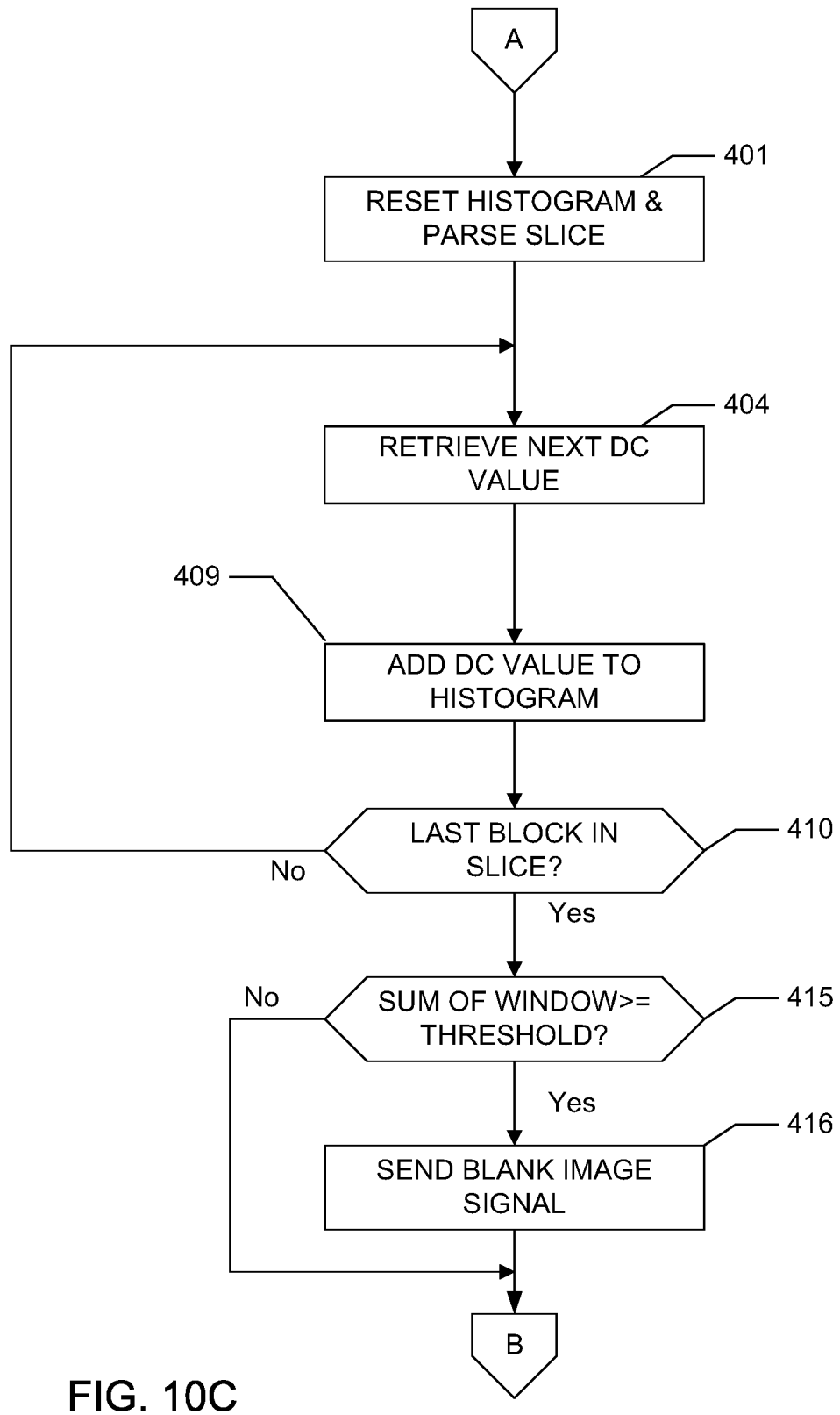

A flowchart representative of example machine readable instructions for implementing the blank image detector 300 of FIG. 5 is shown in FIGS. 10A-10C. In this example, the machine readable instructions comprise a program for execution by a processor such as the processor 2004 shown in the example computer discussed below in connection with FIG. 18. The program may be embodied in software stored on a tangible medium such as a CD-ROM, a floppy disk, a hard drive, a digital versatile disk (DVD), or a memory associated with the processor 2004, but persons of ordinary skill in the art will readily appreciate that the entire program and/or parts thereof could alternatively be executed by a device other than the processor 2004 and/or embodied in firmware or dedicated hardware in a well known manner. For example, any or all of the parser 303, the DC value comparator 306, the DC value counter 308, the comparator 310, the threshold 312, the parser 502, the frame byte calculator 505, the area byte counter 506, the area comparator 508, the area count comparator 514, the histogram generator, and/or the blank frame threshold 516, could be implemented by software, hardware, and/or firmware. Further, although the example program is described with reference to the flowchart illustrated in FIGS. 10A-10C, persons of ordinary skill in the art will readily appreciate that many other methods of implementing the example blank image detector 300 may alternatively be used. For example, the order of execution of the blocks may be changed, and/or some of the blocks described may be changed, eliminated, or combined. For instance, the blocks may be modified to implement any of the alternatives explained above.

The program of FIGS. 10A-10B begins when a new frame is received from the corresponding tuner 114A-114N (block 350). The frame byte calculator 505, the area byte calculator 506, the area buffer 508, and the loop counters (I and K) are reset when a new frame is received (block 350). The frame byte calculator 505 determines if the total number of bits or bytes in the frame exceeds a predetermined threshold (block 351). If the threshold is exceeded, the frame is not blank and control returns to block 350 where processing of the next frame begins. Otherwise, if the frame exhibits a sufficiently low bit/byte count to potentially be blank, the parser 502 then constructs a slice table 520 such as that shown in FIG. 7 and the area byte calculator 506 begins calculating the row byte counts. In the illustrated example, the parser 502 constructs the slice table 520 by examining the frame to find the start address for the first slice (i.e., slice I) in the frame (block 352). It then finds the start address of the next slice (i.e., slice K) in the frame (block 352). In the MPEG II context, if the vertical position of the next slice K is the same as the vertical position for the slice I (block 356), then slice I and slice K are at least partially located in the same row. Accordingly, their byte counts are attributed to the same row I. To this end, the counter K is incremented by one (block 358) and control returns to block 354.

Control continues to loop through blocks 354-358 until a slice K having a vertical position different than the row address of slice I is found (block 356). When such a slice K is found, the area byte calculator 506 computes the number of bytes in the row I associated with slice I by subtracting the start address of slice K from the start address of slice I (block 360). The byte count is recorded in the area buffer 508.

The blank frame candidate identifier 301 then determines if the last byte count has been calculated (block 362). If not, the counter I is set equal to the value in the counter K (block 364), and control returns to block 352. Control continues to loop through blocks 352-364 until the area byte calculator 506 has completed the area byte calculations for the entire frame. Control then advance to block 366.

At block 366, the area count comparator 514 begins analyzing the area byte counts in the area buffer 508 to determine if the frame is a blank frame candidate. In the illustrated example, the area count comparator performs this task by dropping the top 10% of area byte counts and the bottom 10% of area byte counts (block 366). The area count comparator 514 then calculates the standard deviation of the remaining (i.e., the remaining 80%) area byte counts (block 368). The area count comparator 514 then compares the computed standard deviation to the blank frame threshold 516 (block 370). If the standard deviation exceeds the blank frame threshold (block 370), the frame is not a blank frame candidate. Accordingly, control returns to block 350 where the next frame is analyzed as explained above. If, however, the standard deviation does not exceed the blank frame threshold (block 370), the frame is a blank frame candidate. Accordingly, control advances to block 400 (FIG. 10B) where the blank frame tester 302 analyzes a slice from the candidate frame to determine if the candidate frame is a blank frame.

Specifically, as shown in FIG. 10B, the blank frame tester 302 begins analyzing the candidate frame by parsing the slice to review into luminance blocks and resetting the DC value counter 308 (block 400). The DC value comparator 306 then retrieves the first and second DC values from the luminance blocks of the slice (block 402 & 404). The DC value comparator 306 compares the retrieved DC values to one another by, for example, comparing the absolute value of the difference between the retrieved DC values to a predetermined threshold (block 406). (In the case of an absolute DC value paired with a relative DC value, the comparison may comprise taking the absolute value of the relative DC value and then comparing that absolute value to the threshold.) If the threshold is exceeded (block 406), control advances to block 410. If the threshold is not exceeded (block 406), the counter 308 increments (block 408) before control advances to block 410.

At block 410, the DC value comparator 306 determines if the last block in the slice has been analyzed. If not, the second DC value is written into the first DC value variable (block 412). Control then returns to block 404 where the DC value of the next luminance block is retrieved to initiate the next DC value comparison.

Once all of the sequential DC values have been compared (block 410), control advances to block 414. At block 414, the comparator 310 compares the value stored in the counter 308 to a predetermined blank frame threshold 312. If the blank frame threshold is exceeded by the counter value (block 414), a blank image signal is output (block 416). Control then returns to block 350 (FIG. 10A) to initiate processing of the next frame. If the blank frame threshold is not exceeded (block 414), control returns to block 350 (FIG. 10A) without generating the blank image signal.

As explained above, the blank frame detection approach illustrated by FIG. 10B will result in false identification of non-blank frames as blank frames in situations where, for example, the difference between adjacent DC values slowly increments (e.g., a ramp function). To overcome this issue and achieve improved accuracy, in the example of FIG. 8A, the DC value counter 308 and the DC value comparator 306 are replaced by a histogram generator 318. An example manner to implement the apparatus of FIG. 8A is illustrated in FIG. 10C. The flowchart of FIG. 10C replaces the flowchart of FIG. 10B in the implementation of FIG. 8A.

Specifically, as shown in FIG. 10C, the blank frame tester of FIG. 8A begins analyzing the candidate frame by parsing the slice to review into luminance blocks and resetting the histogram (block 400). The histogram generator 318 receives the DC values for a given slice from the parser 303 (block 404) and adds them to a histogram reflecting the DC values in the slice. (block 409).

At block 410, the histogram generator 318 determines if the last block in the slice has been analyzed. If not, control returns to block 404 where the DC value of the next luminance block is received to continue the process of mapping all (or substantially all) of the DC values in a slice to a histogram.

Once all (or substantially all) of the DC values in a slice have been added to the histogram (block 410), control advances to block 415. At block 415, the comparator 310 compares the sum of the peaks reflected in the histogram in a window surrounding the highest peak value to a predetermined blank frame threshold 312. If the blank frame threshold (e.g., 95% of the DC values in a slice) is exceeded by the sum of the peaks located in a predetermined area around the highest peak value (block 415), a blank image signal is output (block 416). Control then returns to block 350 (FIG. 10A) to initiate processing of the next frame. If the blank frame threshold is not exceeded (block 415), control returns to block 350 (FIG. 10A) without generating the blank image signal.

As explained above, in either the example of FIG. 8 or the example of FIG. 8A, the blank image signal is output to the timer 114A-114N corresponding to the blank image detector 116A-116N. If the timer 112A-112N detects a pair of blank image signals which occur less than a predetermined time length apart (and perhaps more than a minimum time length apart), the timer 114A-114N causes the buffer 112A-112N to transfer its contents to the memory 120 so the commercial identifier 126 may analyze the data to determine if one or more commercials are present as explained above. Otherwise, the timer 114A-114N resets itself without causing the buffer 112A-112N to transfer its contents to the memory 120.

In the alternative where the timers 114A-114N are replaced with one or more timers at the commercial identifier 126, the blank image signal is output to the buffer 112A-112N corresponding to the blank image detector 116A-116N. The buffer 112A-112N responds by transferring its contents to the memory 120 so the commercial identifier 126 may analyze the data to determine if one or more commercials are present as explained above. Otherwise, if a blank image signal is not output by the blank image detector 116A-116N, no action is taken and the analysis of the data stream continues in search of blank frames.

Recently, broadcasters have begun transmitting two or more programs within the same broadcast signal wherein one of the programs is intended to be viewed in a primary viewing window and a second one of the programs is intended to be viewed in a secondary viewing window. The secondary viewing window is typically smaller than the primary viewing window. This type of display is commonly referred to as a picture-in-picture (PIP) display and the secondary viewing window is commonly referred to as the picture-in-picture window.

The use of primary and secondary windows permits the broadcaster to present multiple programs or other content on a single screen. For example, a broadcaster may present a news program wherein a commentator is shown in a primary viewing window and a live action news report is shown in the secondary window or vice versa. Alternatively, the two programs may be unrelated. For example, a broadcasting station may be obligated to broadcast the scrolling credits at the end of a movie. Since this may not be interesting to a number of viewers, the broadcasting station may choose to broadcast the credits in a primary window and an advertisement for another program, a news update, or other content or advertisements in a secondary window or vice versa. Either or both of the unrelated programs may carry an advertisement. Thus, to monitor broadcasting of commercials in the primary and secondary windows without resorting to recording all of the broadcast content, it is desirable to detect instances when the primary viewing window is a blank image and instances when the secondary viewing window is a blank image. As explained above, these blank images are inserted between content and commercials. By timing the duration between such blank images, it is possible to determine if the material broadcast in the interval between the blank images is a commercial or content with a reasonable level of accuracy.

Figure 11:
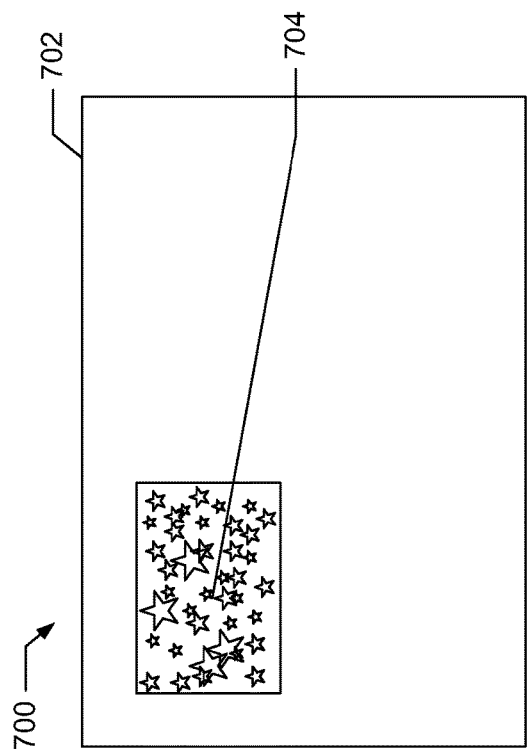
FIG. 11 is an illustration of a blank secondary viewing window (i.e., a picture-in-picture window) embedded in an active primary viewing window.
Figure 12:
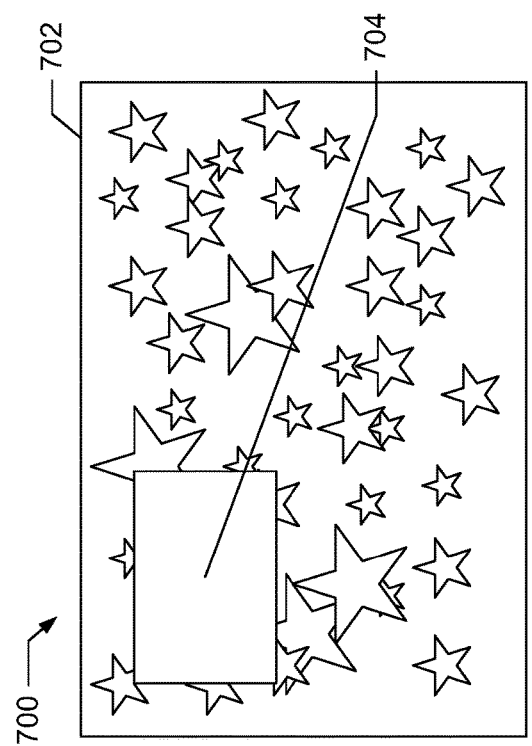
FIG. 12 is similar to FIG. 11, but illustrates a blank primary viewing window and an active secondary viewing window.

FIG. 11 illustrates an example screen 700 carrying a primary viewing window 702 and a secondary viewing window 704. In the example of FIG. 11, the primary viewing window 702 contains content, and the secondary viewing window 704 contains a blank image denoting a transition between content and a commercial. Such a situation is referred to as a blank-in-picture (BIP) situation. FIG. 12 illustrates the example screen 700, but at a time wherein the secondary window 704 contains content and the primary window 702 contains a blank image denoting a transition between the content and a commercial. Such a situation is referred to as a picture-in-blank (PIB) situation.

Figure 13:
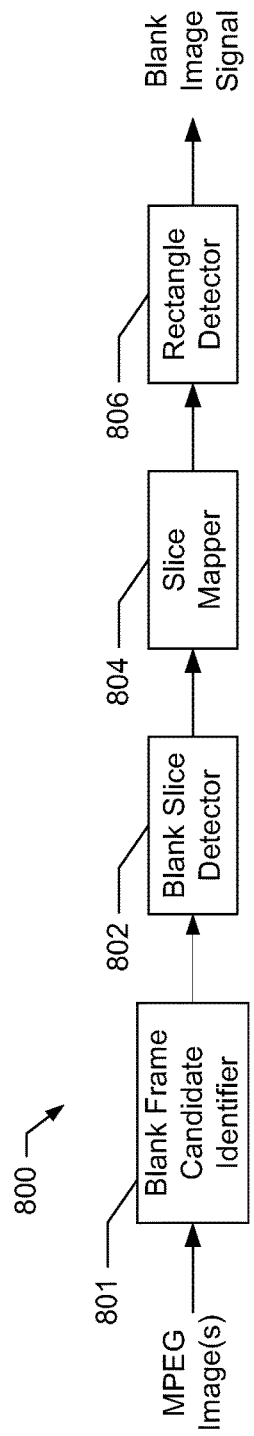
FIG. 13 is a block diagram illustrating another example blank image detector.

For the purpose of detecting blank images in primary and secondary windows 702, 704, the blank image detector of FIG. 2 may be implemented by the example blank image detector 800 shown in FIG. 13. In the illustrated example, the blank image detector 800 includes a blank image candidate identifier 801, a blank slice detector 802, a slice mapper 804, and a rectangle detector 806. As with the blank image candidate identifier 301 discussed above, the blank image candidate identifier 801 performs one or more relatively coarse tests to screen out images that are too complex to be blank images. For example, the blank image detector 301 may screen out images who have too many bits/bytes to be a blank image and/or may screen out images who have too complex of a byte allocation distribution to be a blank image. However, because in the PIP context, the secondary window may be blank when the primary window is not blank and vice versa, the test performed by the blank image candidate identifier 801 must be refined relative to the test performed by the blank image candidate identifier 301 discussed above. In the illustrated example, this refinement is achieved by structuring the blank image candidate identifier 801 to examine I-frames for a group containing at least a predetermined number of slices that are located near each other within a frame and that satisfy a low byte allocation criterion, and to examine P and B frames for more than a predetermined number of intracoded macro blocks located in a rectangular area. Only frames that meet these criteria are identified as blank frame candidates. Preferably, only blank frame candidates are passed to the blank slice detector 802 for further examination.

Figure 13A:
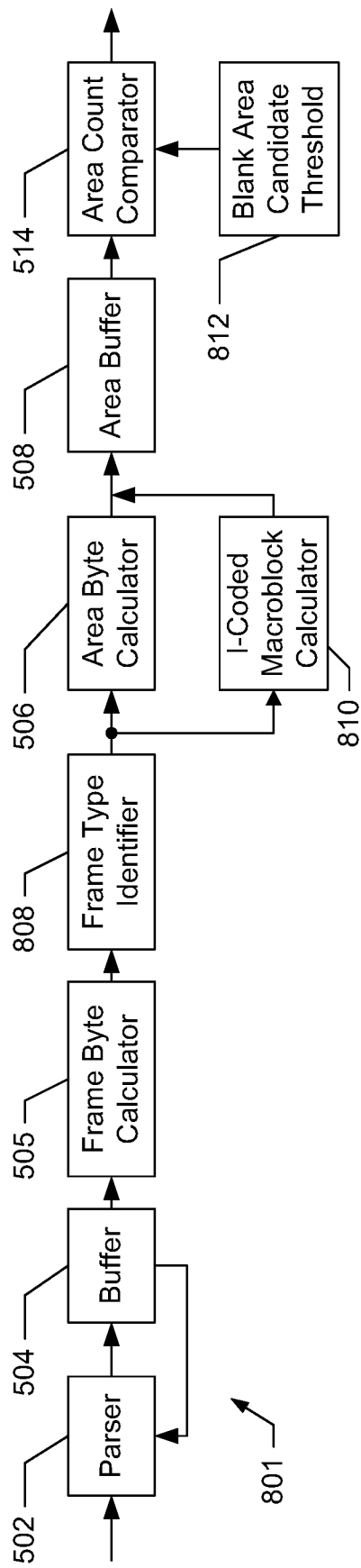
FIG. 13A is a block diagram illustrating an example blank frame candidate identifier for use in the PIP context.

To this end, the blank frame candidate identifier 801 may be structured similar to the blank frame candidate identifier 301 shown in FIG. 6. An example blank frame candidate identifier 801 is shown in FIG. 13A. Because some of the structures in FIG. 13A are identical to structures in FIG. 6, corresponding structures in FIGS. 6 and 13A have been given identical reference numbers. The following description will not repeat the description of those structures discussed in connection with FIG. 6. Instead, the description of FIG. 13A will focus on the differences between FIG. 13A and FIG. 6.

As in the example of FIG. 6, in the example of FIG. 13A the blank frame candidate identifier 801 performs a two part test to identify blank frame candidates. The first test is performed by the frame byte calculator 505. As explained above, the frame byte calculator 505 screens out frames as not blank that contain more than a predetermined number of bits or bytes. In the illustrated example, only frames having less than the predetermined number of bits/bytes are analyzed under the second test.

Turning to the second test to determine if a frame is a blank candidate, in the example of FIG. 13A, the blank frame candidate identifier 801 is structured to process I-frames differently than P and B frames. Thus, the blank frame candidate identifier 801 is provided with a frame-type identifier 808. The frame-type identifier 808 identifies a frame as an I-frame, a P-frame or a B-frame. If the frame-type identifier 808 identifies a frame as an I-frame, it activates the area byte calculator 506. The area byte calculator 506 operates as explained above to calculate the number of bytes in each area of the frame and to store the computed byte counts in the area buffer 508. The area count comparator 514 then compares each of the area byte counts in the area buffer 508 to a blank area candidate threshold (which replaces the blank frame candidate threshold 516 of FIG. 6). The area count comparator 514 determines that a BIP or PIB situation may be presented by an I-frame if a group of at least a predetermined number of areas that meet the blank area candidate threshold and are located near each other within a frame is identified.

On the other hand, if the frame-type identifier 808 identifies the frame type tested as not an I-frame (i.e., a P-frame or a B-frame), it activates the intracoded macro block calculator 810. The intracoded macro block calculator 810 counts the number of intracoded macro blocks in the frame. The area count comparator 514 determines that a BIP or PIB situation may be presented by a P or B frame if the frame contains a predetermined number of intracoded macro blocks located in generally the same area.

Returning to FIG. 13, as explained in detail below, the blank slice detector 802 of FIG. 13 processes I-frames, P-frames and B-frames in the same manner. The blank slice detector 802 receives a blank frame candidate from its corresponding blank frame candidate identifier 801 and analyzes the slices contained within the blank frame candidate frame to determine if they are blank.

The slice mapper 804 maps the blank slices identified by the blank slice detector 802 to an x-y coordinate system corresponding, for example, to the physical location of the slice in the frame. A portion of an example map of a frame created by the slice mapper 804 is shown in FIG. 15 wherein an "X" indicates a non-blank slice or slice portion, and a "B" indicates a blank slice or slice portion. After the blank slice detector 802 has analyzed every slice that contains intracoded macro blocks in a frame, and the slice mapper 804 has mapped each blank slice identified in the frame to the x-y coordinate system, the rectangle detector 806 analyses the x-y coordinate system to determine if a substantially rectangular area is defined by the blank slices (i.e., the secondary window is blank such that a BIP situation is presented) or if the blank slices surround a substantially rectangular area (i.e., the primary viewing window is blank such that a PIB situation is presented). If either situation occurs (e.g., a blank primary window or a blank secondary window), the blank image detector 800 outputs a blank image signal, as explained above. The blank image signal preferably indicates if the frame is a BIP or a PIB, and the location of the blank or active window.

Figure 14:
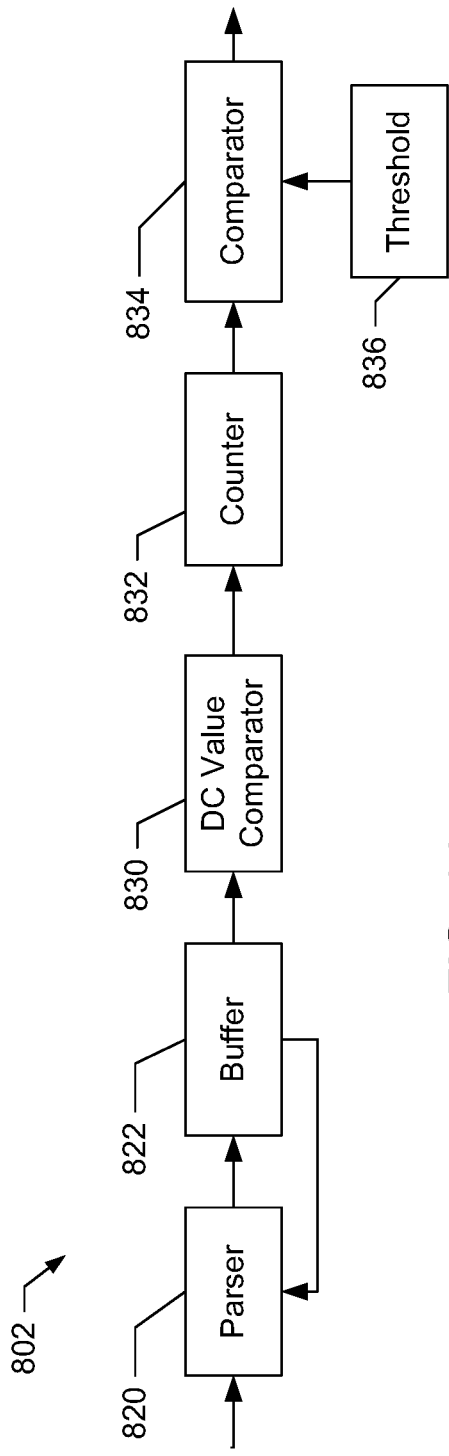
FIG. 14 is a block diagram illustrating an example blank slice detector.

An example blank slice detector 802 is shown in greater detail in FIG. 14. The example blank slice detector 802 of FIG. 14 includes a parser 820 and a buffer 822. The parser 820 and the buffer 822 may be identical to the parser 302 and the buffer 304 discussed above. Therefore, the parser 820 and the buffer 822 are not discussed in further detail here. Instead, the interested reader is referred to the above description of the parser 302 and the buffer 304 for a full discussion of those structures.

In order to determine if a slice is a blank slice, the example blank slice detector 802 of FIG. 14 is further provided with a DC value comparator 830, a counter 832, and a comparator 834. The DC value comparator 830 functions similar to the DC value comparator 306 in that it compares the DC values of sequential pairs of luminance blocks 230-236 in the low byte allocation slices to determine if there is a difference in average brightness between sequential luminance blocks. If no change is detected (e.g., the compared DC values are identical), the DC value comparator 830 outputs a no change signal (e.g., a logic high signal). Because noise can cause some unintended brightness changes, the DC value comparator 830 may be structured to output the no change signal whenever the difference between the compared DC values is zero or within a predetermined range of zero.

The output of the DC value comparator 830 is communicated to the counter 832. The counter 832 increments in response to every no change signal received from the DC value comparator 830. The counter 832 is reset to zero whenever examination of a new slice begins.

When all of the DC values in a slice have been examined, the comparator 834 compares the value stored in the counter 832 to a predetermined threshold value 836. If the counter 832 counts more than the threshold value 836 of no change signals from the DC value comparator 830, the comparator 834 outputs a blank slice signal indicating that the examined slice is a blank slice. This blank slice signal is processed by the slice mapper 804 as explained above. In particular, the slice mapper 804 maps the corresponding slice to a corresponding physical location in an xy-coordinate system corresponding to a display screen for later analysis by the rectangle detector 806 as shown in the example of FIG. 15.

The predetermined threshold value 836 used when examining I-frames may be set to any desired value. For example, it may be set to correspond to a number equivalent to any desired percentage of the total number of luminance blocks contained in a slice (e.g., 51%, 90%, etc.).

Rather than employing the DC value comparator 830 and the counter 832, the blank slice detector 802 may include a histogram generator 831 as shown in FIG. 14A. The histogram generator 831 may map the DC values output by the parser 820 to a histogram reflecting the DC value distribution of a slice. The histogram may then be examined by the comparator 834 to determine if a predetermined number of DC values represented in the histogram the same (e.g., reflecting no brightness variance or small brightness variance due to noise). If the histogram meets the threshold criteria for a blank slice, the blank slice detector 802 identifies the slice as a blank slice.

A flowchart representative of example machine readable instructions for implementing the blank image detector 800 of FIGS. 13, 13A, 14 and 14A is shown in FIGS. 16A-16F. In this example, the machine readable instructions comprise a program for execution by a processor such as the processor 2004 shown in the example computer 1000 discussed below in connection with FIG. 18. The program may be embodied in software stored on a tangible medium such as a CD-ROM, a floppy disk, a hard drive, a digital versatile disk (DVD), or a memory associated with the processor 2004, but persons of ordinary skill in the art will readily appreciate that the entire program and/or parts thereof could alternatively be executed by a device other than the processor 2004 and/or embodied in firmware or dedicated hardware in a well known manner. For example, any or all of the blank slice detector 802, the slice mapper 804, the rectangle detector 806, the intracoded macro block calculator 810, the parser 820, the frame-type detectors 808, the frame byte calculator 505, the DC value comparator 830, the counter 832, the comparator 834 and/or the thresholds 836 could be implemented by software, hardware, and/or firmware. Further, although the example program is described with reference to the flowchart illustrated in FIGS. 16A-16F, persons of ordinary skill in the art will readily appreciate that many other methods of implementing the example blank image detector 800 may alternatively be used. For example, the order of execution of the blocks may be changed, and/or some of the blocks described may be changed, eliminated, or combined.

Figure 16A:
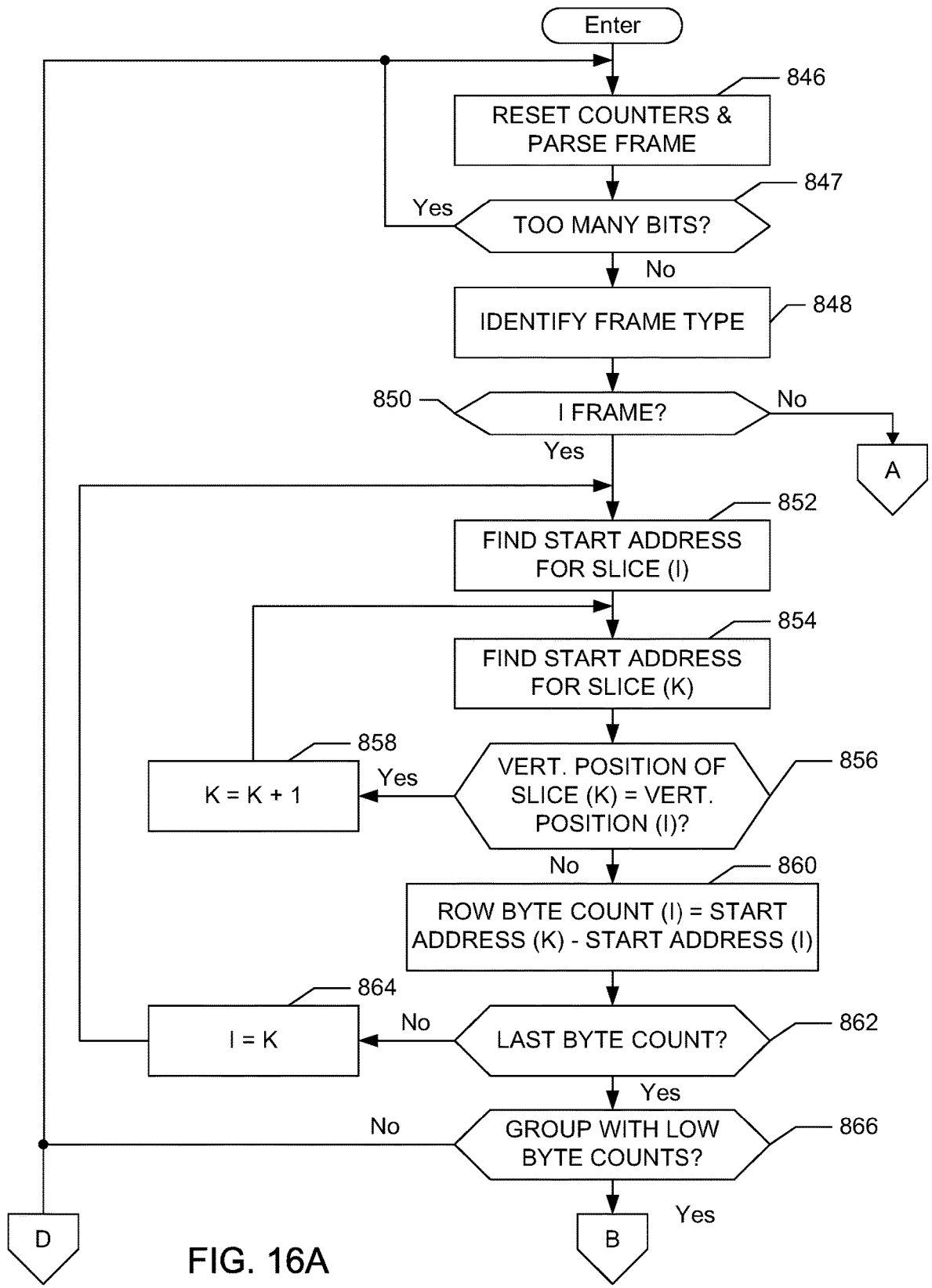
FIGS. 16A-16F are a flowchart representative of machine readable instructions which may be executed to implement the example blank image detector of FIGS. 13 and 14 and/or the example blank image detector of FIGS. 13 and 14A.
Figure 16B:
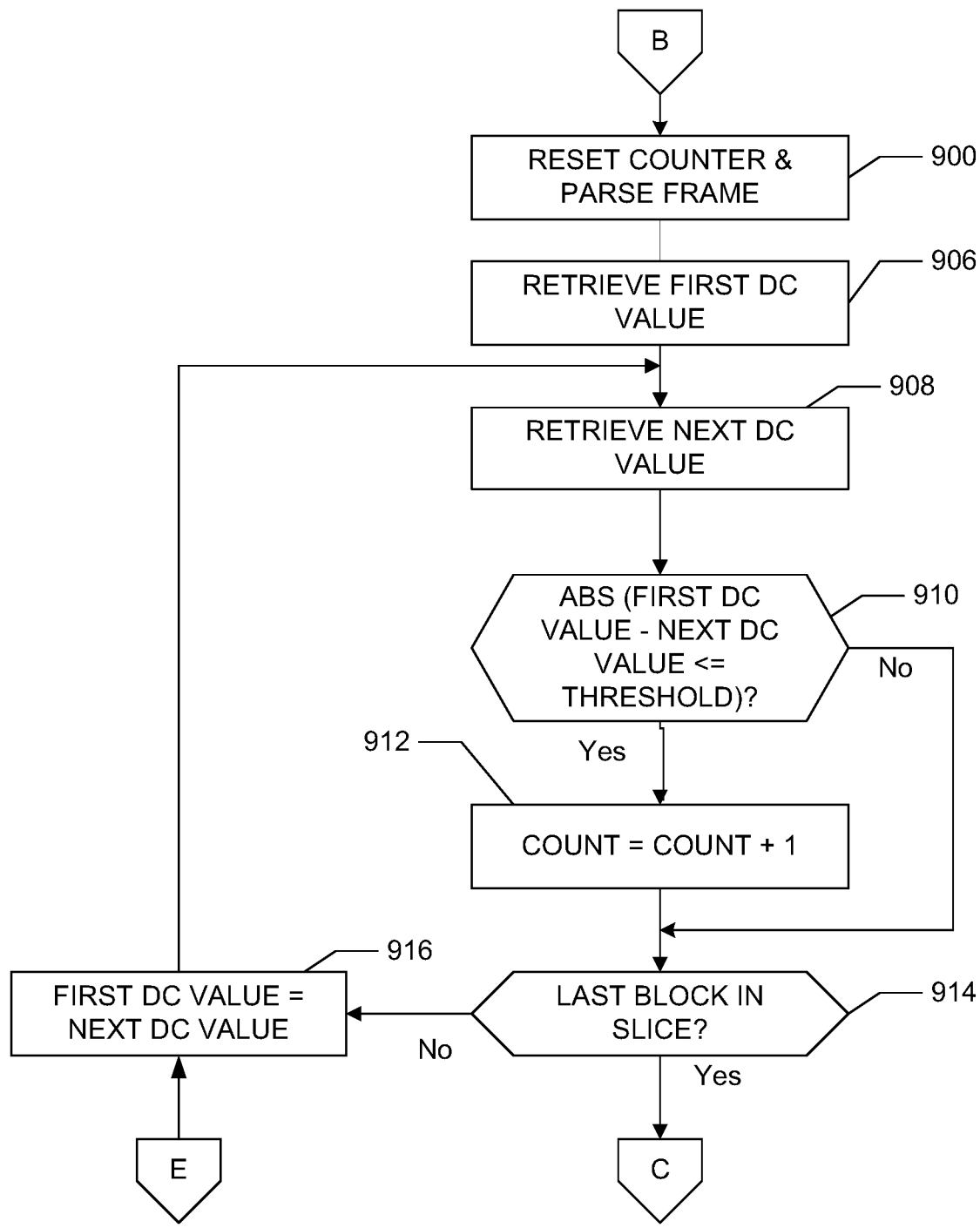
Figure 16C:
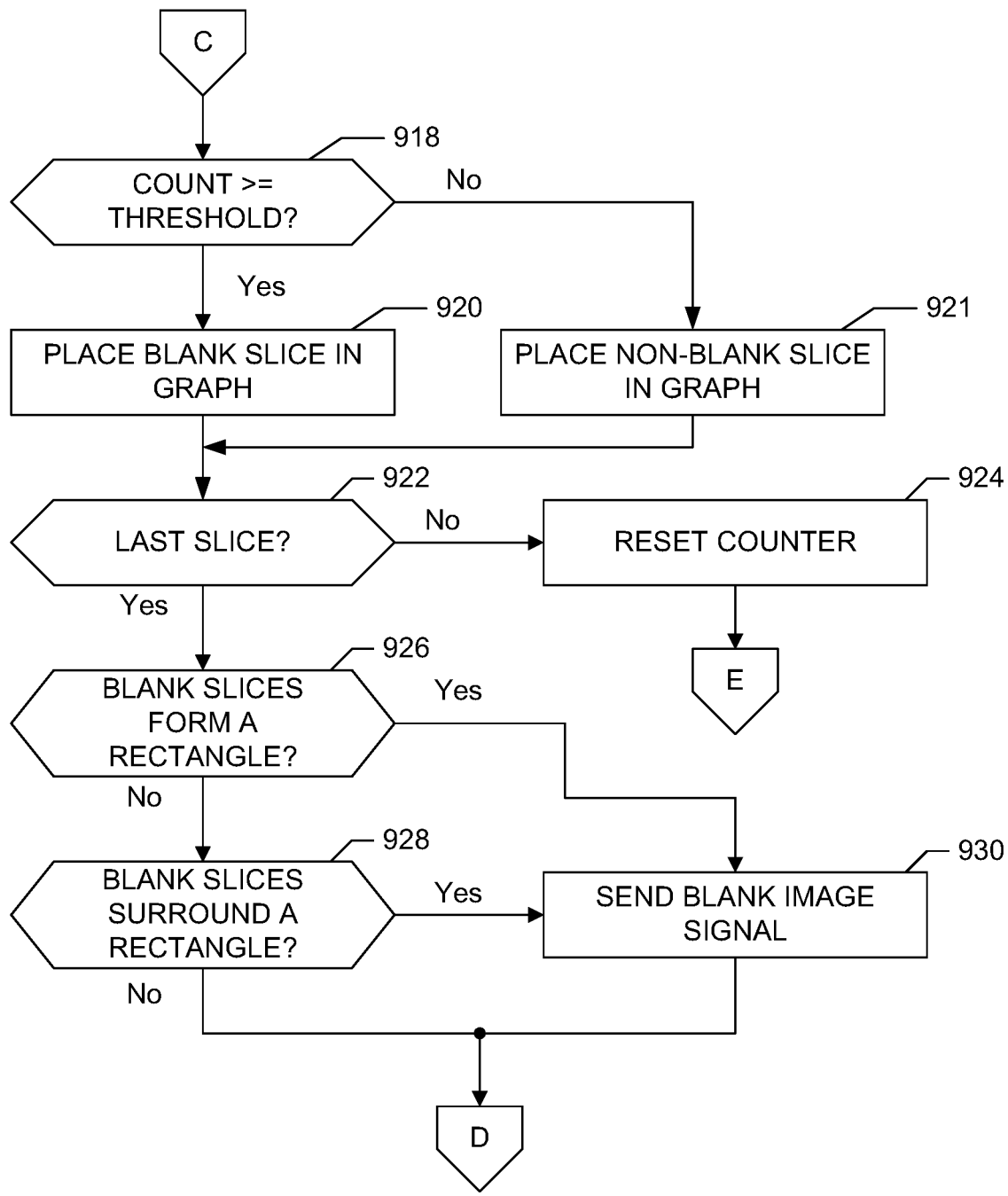
Figure 16D:
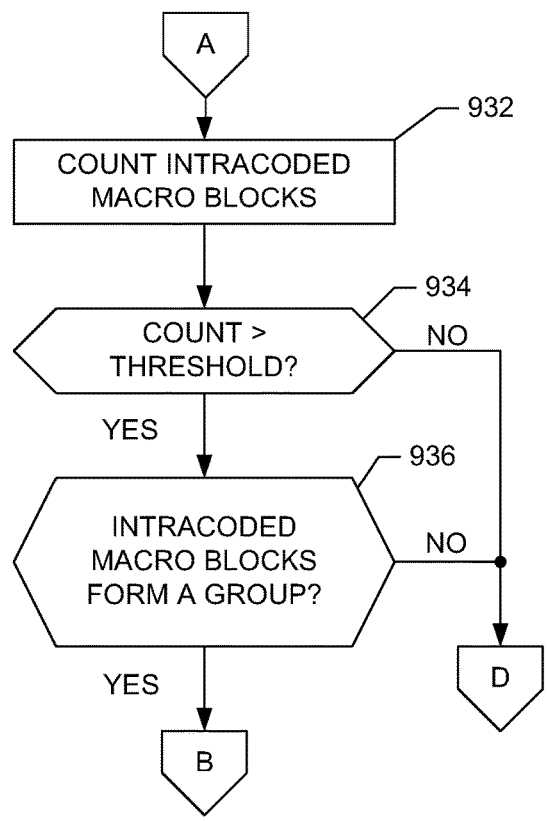

The program of FIGS. 16A-16D begins when a new frame is received from the corresponding tuner 114A-114N. The area byte calculator 506, the area buffer 508, and the loop counters (I and K) are reset when a new frame is received (block 846). The frame byte calculator 505 then determines if the frame has a sufficiently low byte count to be blank (block 847). If not, control returns to block 846 where the next frame is received for processing. If, on the other hand, the frame byte calculator 505 determines that the frame has less than a threshold amount of bytes (block 847), the frame-type detector 808 then determines if the frame to be examined is an I-frame (block 848). If the frame is an I-frame (block 850), control advances to block 852. Otherwise, control advances to block 932 (FIG. 16D).

Assuming for purposes of discussion that the frame is an I-frame (block 850, FIG. 16A), the parser 502 begins constructing a slice table 520 such as that shown in FIG. 7 and the area byte calculator 506 begins calculating the area byte counts. In the illustrated example, the parser 502 constructs the slice table 520 by examining the frame to find the start address for the first slice (i.e., slice I) in the frame (block 852). It then finds the start address of the next slice (i.e., slice K) in the frame (block 852). In the MPEG II context, if the vertical position of the next slice K is the same as the vertical position for the slice I (block 856), then slice I and slice K are at least partially located in the same row. Accordingly, their byte counts are attributed to the same row I. To this end, the counter K is incremented by one (block 858) and control returns to block 854.

Control continues to loop through blocks 854-858 until a slice K having a row address different than the row address of slice I is found (block 856). When such a slice K is found, the area byte calculator 506 computes the number of bytes in the row I associated with slice I by subtracting the start address of slice K from the start address of slice I (block 860). The byte count is recorded in the row buffer 508.

The blank frame candidate identifier 801 then determines if the last byte count has been calculated (block 862). If not, the counter I is set equal to the value in the counter K (block 864), and control returns to block 852. Control continues to loop through blocks 852-864 until the area byte calculator 506 has completed the row byte calculations for the entire frame. Control then advance to block 866.

At block 866, the area count comparator 514 begins analyzing the row byte counts in the area buffer 508 to determine if the frame is a blank frame candidate. In the illustrated example, the area count comparator 514 performs this task by comparing each of the row byte counts in the area buffer 508 to a blank area candidate threshold. The area count comparator 514 determines that a BIP or PIB situation is presented if a group containing at least a predetermined number of slices that meet the blank area candidate threshold and are located near each other within a frame is identified. In such an instance, the frame is a blank frame candidate and control advances to block 900 of FIG. 16B. Otherwise, if no such group is detected, the frame is not a blank frame candidate and control returns to block 846 where analysis of the next frame begins.

As shown in FIG. 16B, to begin analyzing the candidate frame, the parser 820 parses the frame, and the counter 832 is reset (block 900). The DC value comparator 830 then retrieves the DC values from the first and second luminance blocks of the first low byte count slice of the blank frame candidate (blocks 906 & 908). The DC value comparator 830 compares the retrieved DC values to one another by, for example, comparing the absolute value of the difference between the retrieved DC values to a predetermined threshold (block 910). If the threshold is exceeded (block 910), control advances to block 914. If the threshold is not exceeded (block 910), the counter 832 increments (block 912) before control advances to block 914.

At block 914, the parser 820 determines if the last block in the slice has been analyzed. If not, the second DC value is written into the first DC value variable (block 916). Control then returns to block 908 where the DC value of the next luminance block is retrieved to initiate the next DC value comparison.

Once all of the sequential DC values in a slice have been compared (block 914), control advances to block 918 (FIG. 16C). At block 918, the comparator 834 compares the value stored in the counter 832 to a predetermined threshold. If the threshold is exceeded by the counter value (block 918), the slice mapper 804 maps a blank slice to the physical location of the slice in an xy-coordinate system representative of the blank frame candidate being analyzed (block 920)(see FIG. 15). Control then advances to block 922. If the threshold is not exceeded (block 918), the slice mapper 804 maps a non-blank slice to the xy-coordinate system representing the frame (block 921). (All non-low byte allocation slices may also be mapped as non-blank slices in the graph.) Control then advances to block 922.

At block 922, it is determined if the last low byte allocation slice in the current frame has been analyzed. If not, the counter is reset (block 924). Control then returns to block 916 of FIG. 16B where analysis of the next low byte allocation slice of the frame begins as explained above. Control continues to loop through blocks 906-924 until every low byte allocation slice of a frame has been analyzed and mapped to the xy-coordinate system as a blank slice or a non-blank slice (block 922).

Figure 17:
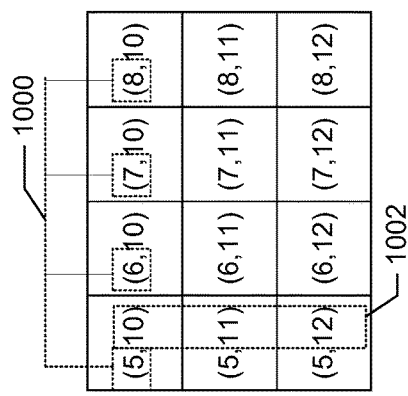
FIG. 17 is a block diagram illustrating xy-coordinate pairs associated with a rectangular region.

When all of the low byte allocation slices of a frame have been categorized and mapped as explained above (block 922), the rectangle detector 806 analyzes the slice map created by the slice mapper 804 to determine if the blank slices (if any) in the frame form a substantially rectangular area (block 926). Persons of ordinary skill in the art will appreciate that the rectangle detector 806 may detect blank rectangular regions in the slice map in a plurality of different manners. For example, as shown in FIG. 17, the rectangle detector 806 may analyze the xy coordinates associated with the blank slices for patterns indicative of a rectangular area. For example, the rectangle detector 806 may identify an area of the slice map as containing a blank rectangle if the sequences of x coordinates 1000 (e.g., 5, 6, 7, 8) of an area containing blank slices and no non-blank slices are consistent with one another (e.g., all four horizontal sequences in FIG. 17 are 5, 6, 7, 8), and the sequences of y coordinates 1002 (e.g., 10, 11, 12) of that same area are also consistent with one another (e.g., all three vertical sequences in FIG. 17 are 10, 11, 12). Of course, a region of blank slices need not form a perfect rectangle to be identified as a rectangular region. Instead, predefined tolerances may be permitted. For example, a predefined number of coordinates in each sequence may be inconsistent with the other sequences and still be considered a match. For example, the sequence "5, 6, 7, 8, 9, 10" may be considered a match to the sequence "5, 6, 7, 8, 10". In this manner, small errors, rounded corners, etc. may be ignored.

Also, to avoid falsely identifying small blank areas of a primary window as reflecting a blank PIP window, the rectangle detector 806 may require the blank rectangular area to cover at least a predetermined area before it is identified as a blank PIP window. For example the rectangle detector 806 may compute the area of the blank area and compare the computed area to a predetermined threshold. Only if the threshold is exceeded is the blank area declared a blank PIP window.

If the rectangle detector 806 identifies a blank rectangle (block 926), control advances to block 930 where a blank image signal is generated. As explained above, if a pair of blank images that are separated by less than a predetermined length of time corresponding to the maximum expected length of a commercial break (e.g., 5 minutes) are detected, the monitoring station 106 identifies the portion of the broadcast signal occurring between the blank images as containing a commercial and, thus, stores the frames or proxies for the frames occurring between the blank images for later use in identifying the commercials.

If the rectangle detector 806 does not identify a blank rectangle (block 926), control advances to block 928. At block 928, the rectangle detector 806 analyzes the slice map created by the slice mapper to determine if the blank slices (if any) in the frame form an area of blank slices (i.e., a blank primary window) bounding a substantially rectangular area of non-blank slices (e.g., a non-blank secondary window) (block 928). Persons of ordinary skill in the art will appreciate that the rectangle detector 806 may detect a blank region which bounds a non-blank rectangular area in the slice map in a plurality of different manners. For example, as shown in FIG. 17, the rectangle detector 806 may analyze the xy coordinates associated with non-blank slices bounded by blank slices for patterns indicative of a rectangular area. For example, the rectangle detector 806 may identify an area of the slice map as containing a non-blank rectangle bounded by blank slices if the sequences of X coordinates 1000 (e.g., 5, 6, 7, 8) of an area containing non-blank slices bounded by blank slices are consistent with one another (e.g., all four horizontal sequences in FIG. 17 are 5, 6, 7, 8), the sequences of Y coordinates 1002 (e.g., 10, 11, 12) of that same area are also consistent with one another (e.g., all three vertical sequences in FIG. 17 are 10, 11, 12), and no, or substantially no, slices outside the rectangular area are non-blank slices. Again, the non-blank rectangular region bounded by the blank slices need not be a perfectly rectangular region for the region of blank slices to be identified as a blank primary window. Also, a minimum area test may be employed as explained above to avoid falsely identifying a non-blank area surrounded by a blank area as a PIP window located in a blank primary window.

If the rectangle detector 806 identifies a blank primary window (block 928), control advances to block 930 where a blank image signal is generated as explained above. If the rectangle detector 806 does not identify a blank primary window (block 928), or after the blank image signal is generated (block 930), control returns to block 850 (FIG. 16A) where analysis of the next frame begins.

Returning to block 850 of FIG. 16A, if the frame-type detector 808 determines that the blank frame candidate to be analyzed is a P-frame or a B-frame (block 850), control advances to block 932 of FIG. 16D. At block 932, the intracoded macro block calculator counts the number of intracoded macro blocks contained in the frame. Since blank areas in P-frames and B-frames are best represented by intracoded macro blocks, non-blank P-frames and non-blank B-frames will not contain a large number of intracoded macro blocks. Therefore, the presence of more than a predetermined number (e.g., more than 25% of the macro blocks) of intracoded macro blocks indicates that the frame may contain a blank area. Therefore, if more than the predetermined number of intracoded macro blocks are counted in the frame (block 934), the frame may be a PIB or BIP frame and control advances to block 936. Otherwise, the frame is not a PIB or BIP frame, and control returns to block 846 of FIG. 16A.

Assuming for purposes of discussion that the P-Frame or B-frame meets the quantity test for a BIP or PIB frame (block 934), the area count comparator 514 determines if the intracoded macro blocks fare grouped together so that they may represent a PIB or BIP frame (block 936). If not, the frame is not a PIB or BIP frame, and control returns to block 846 of FIG. 16A. On the other hand, if the intracoded macro blocks are grouped together (block 936), the frame may be a BIP or PIB frame and control advances to block 900 of FIG. 16B.

Control then proceeds through blocks 900-930 as explained above until the P-frame or B-frame is identified as a PIB, a BIP or a non-blank image.

Figure 16E:
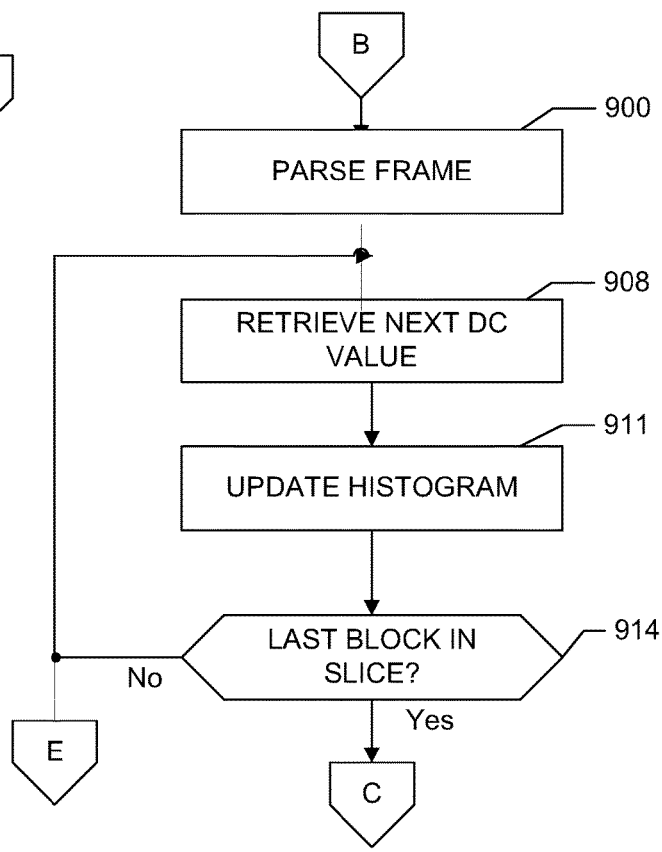
Figure 16F:
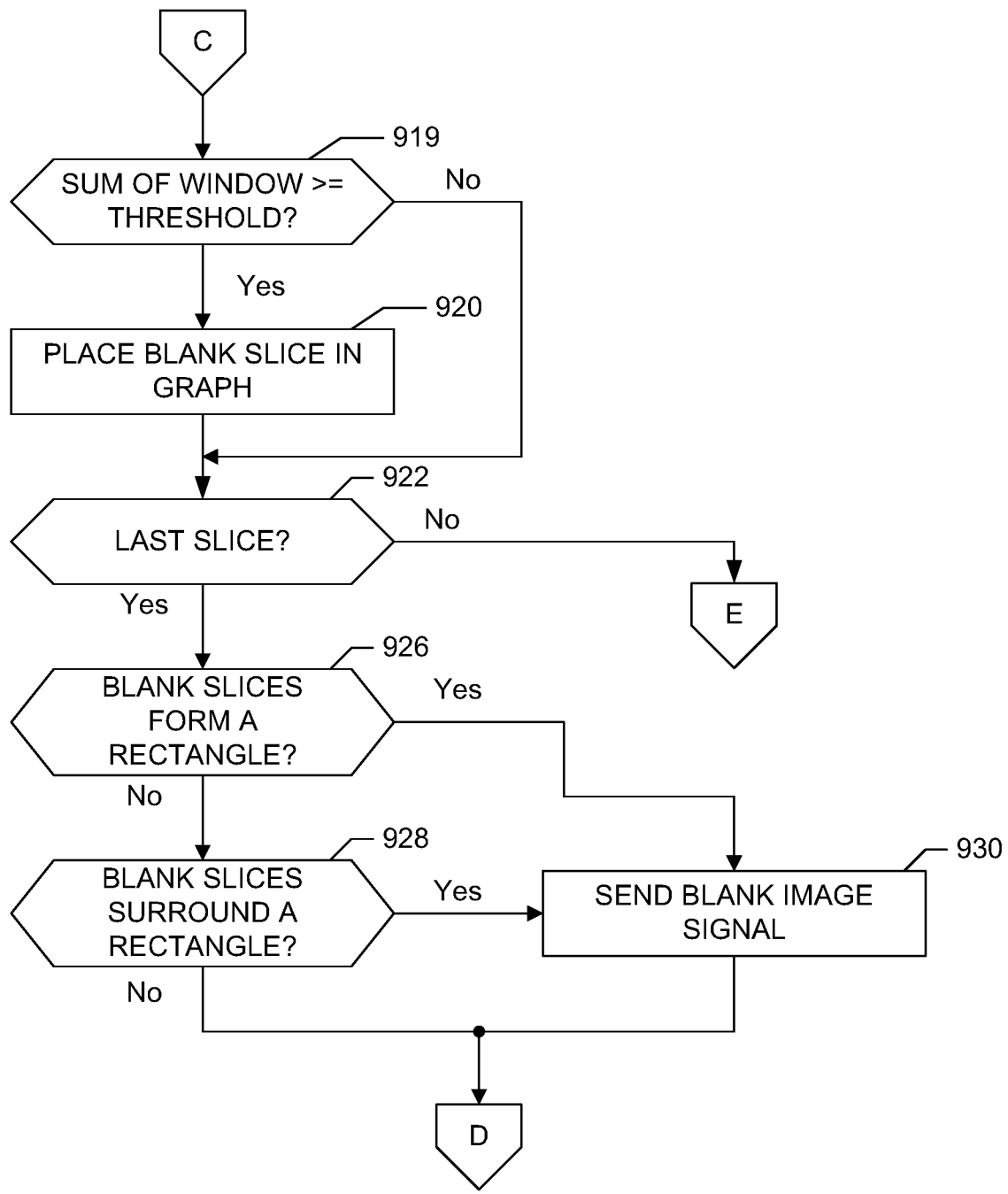

The flowcharts of FIGS. 16B-16D are directed toward the example illustrated in FIG. 14. However, as noted above and illustrated in FIG. 14A, the blank slice detector 802 may alternatively be structured to include a histogram generator 831 instead of the DC value comparator 830 and the counter 832. Modified versions of FIGS. 16B and 16C reflecting the changes required to implement the blank slice detector of FIG. 14A are shown in FIGS. 16E and 16F. In FIGS. 16E and 16F as respectively compared to FIGS. 16B and 16C, like reference numerals reflect like blocks. Thus, descriptions of those identical blocks are omitted in the interest of brevity. Instead, the following identifies the differences between FIG. 16B. and FIG. 16E and between FIG. 16C and FIG. 16F.

As shown in FIG. 16E, blocks 906 and 916 are eliminated, block 900 is modified to eliminate resetting of the counter, and blocks 910-912 are replaced with a block 911 in which the histogram is updated by the histogram generator 831 to reflect the retrieved DC value. As shown in FIG. 16F, block 924 is eliminated and block 918 is replaced with block 919 which sums a window of peak(s) of the histogram around the value representing a zero DC value, and compares the sum to the threshold as explained above in connection with block 415 of FIG. 10C. All other blocks may remain the same.

Figure 18:
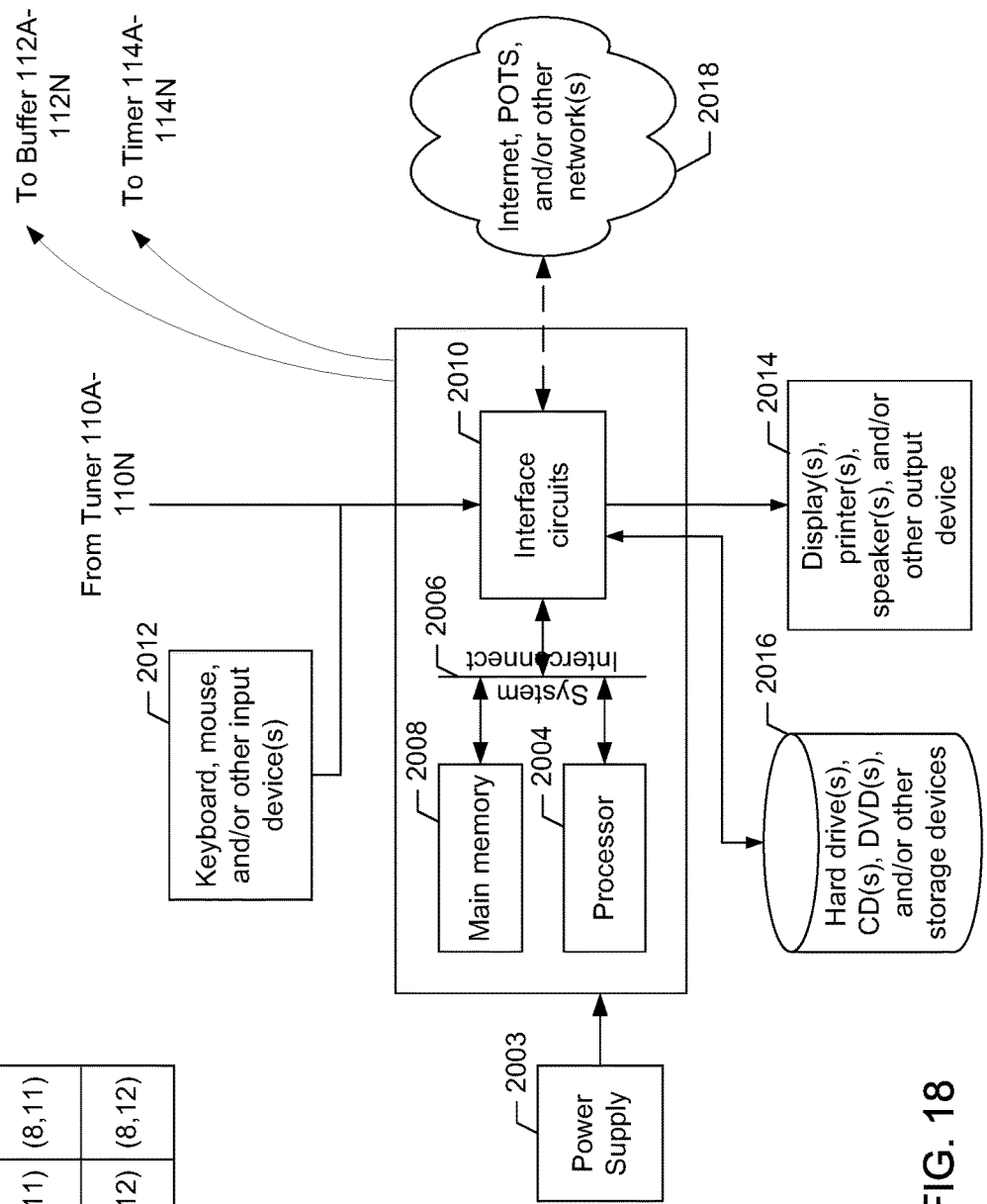
FIG. 18 is a block diagram of an example computer which may be programmed to implement the apparatus of FIGS. 5, 9 and/or 13.

A block diagram of an example apparatus that may implement any or all of the blank image detectors 116A-116N, 300, 500 and 800 is illustrated in FIG. 18. The apparatus may be a personal computer (PC), an application specific device, and/or any other computing device. In the illustrated example, the apparatus includes a processor 2004 powered by a power supply 2003. The processor 2004 may be electrically coupled by a system interconnect 2006, to a main memory 2008, and to one or more interface circuits 2010. The system interconnect 2006 may be, for example, an address/data bus. Of course, a person of ordinary skill in the art will readily appreciate that interconnects other than busses may be used to connect the processor unit 2004 to the main memory 2008. For example, one or more dedicated lines and/or a crossbar may be used to connect the processor 2004 to the main memory 2008.

The processor 2004 may be implemented, for example, by a microprocessor from the Intel Pentium® family of microprocessors, the Intel Itanium® family of microprocessors, the Intel Centrino® family of processors and/or the Intel XScale® family of processors. The processor 2004 may include any type of well known cache memory, such as static random access memory (SRAM). The main memory 2008 may include dynamic random access memory (DRAM), but may also include non-volatile memory. The main memory 2008 may store one or more programs which may be executed by the processor 2004 in a well known manner.

The interface circuit(s) 2010 may be implemented using any type of well known interface standard, such as an analog cable interface, a digital cable interface, a satellite signal interface, an Ethernet interface, and/or a Universal Serial Bus (USB) interface. One or more input devices 2012 may be connected to the interface circuits 2010 for entering data and commands into the processor 2004. For example, an input device 2012 may be a keyboard, a mouse, a touch screen, a track pad, a track ball, an isopoint, and/or a voice recognition system.

One or more displays, printers, speakers, and/or other output devices 2014 may also be connected to the processor 2002 via one or more of the interface circuits 2010. The display 2014 may be a cathode ray tube (CRTs), a liquid crystal display (LCDs), or any other type of display. The display 2014 may generate visual indications of data generated during operation of the processor 2002. The visual display may include prompts for human operator input, calculated values, detected data, etc.

The apparatus may also include one or more storage devices 2016. For example, the apparatus may include one or more hard drives, a compact disk (CD) drive, a digital versatile disk drive (DVD), and/or other computer media input/output (I/O) devices.

The apparatus may also exchange data with other devices such as the data processing center 108 via a connection to a network 2018. The network connection may be any type of network connection, such as an Ethernet connection, digital subscriber line (DSL), telephone line, coaxial cable, etc. The network 2018 may be any type of network, such as the Internet, a telephone network, a cable network, and/or a wireless network.

From the foregoing, persons of ordinary skill in the art will appreciate that methods and apparatus have been disclosed to detect a commercial/advertisement in a digital video broadcast signal without uncompressing the signal.

The disclosed methods and apparatus advantageously detect blank frames in a digital broadcast stream without decompressing the stream. The disclosed methods and apparatus may be employed in multiple contexts and manners. For example, the disclosed methods and apparatus may be adapted to detect blank frames in a primary screen and/or a secondary screen in a picture-in-picture environment.

While the foregoing disclosure was made with respect to example systems and methods for monitoring the broadcast of video signals, it should be understood that the teachings of this disclosure may alternatively or additionally be applied to monitoring systems adapted to monitor any other type of video display system. Accordingly, while the foregoing described example systems and processes, persons of ordinary skill in the art will readily appreciate that the disclosed examples are not the only way to implement such systems.

Additionally, while the examples disclosed herein refer to "bits," "bytes," bit allocations," "byte counts," etc., persons of ordinary skill in the art will appreciate that bits can be grouped in many ways, for example, into bytes. Therefore, performing any of the functions described herein using bits, bytes, or any other grouping of bits are equivalent, and the use of the words "bit" and "byte" in this disclosure and the appended claims are meant to be interchangeable with one another and with any other unit of digital data (e.g., kilobits, kilobytes, etc.)

Furthermore, although certain methods, apparatus, and articles of manufacture have been described herein, the scope of coverage of this patent is not limited thereto. On the contrary, this patent covers all apparatus, methods, and articles of manufacture fairly falling within the scope of the appended claims either literally or under the doctrine of equivalents.

What is claimed is:

1. An apparatus to detect a blank image within a compressed media signal, the apparatus comprising:

a buffer to store a compressed digital image, the compressed digital image being a frame of the compressed media signal;

a blank frame candidate identifier means to:

analyze a total number of bits in the compressed digital image stored in the buffer to determine if the compressed digital image has a data size less than a first threshold;

when the data size is less than the first threshold, determine a number of bits in multiple areas of the compressed digital image and store the number of bits associated with each of the multiple areas in the buffer;

analyze the number of bits in multiple areas of the compressed digital image stored in the buffer to determine if a deviation between the number of bits within the multiple areas is less than a second threshold;

when in response to the deviation between the number of bits within the multiple areas being less than the second threshold, identify the compressed digital image as a blank image candidate; and when the compressed digital image is not identified as a blank image candidate, discard the compressed digital image from the buffer;

a blank frame tester means to:

when the compressed digital image is identified as a blank image candidate, determine a number of DC values of the blank image candidate that meet a criterion and store the DC values in the buffer;

compare the determined number of DC values stored in the buffer meeting the criterion to a third threshold; and identify the compressed digital image as a blank image if the determined number of DC values exceeds the third threshold; and a commercial identifier means to:

in response to identifying the blank image, identify an advertisement of a media stream associated with the compressed digital image; and transmit the advertisement to a data processing center;

wherein the blank frame tester means determines the number of DC values meeting the criterion by determining a number of relative DC values that are less than a DC value threshold.

* * * * *